(12) United States Patent
Choi et al.

(10) Patent No.: US 12,718,867 B2
(45) Date of Patent: Aug. 25, 2026

(54) MEMORY DEVICE INCLUDING SUB-WORDLINE DRIVER LOCATED BELOW MEMORY CELL ARRAY AND WORD LINES DRIVEN BY SUB-WORDLINE DRIVER

(71) Applicant: Samsung Electronics Co., Ltd., Suwon-si (KR)

(72) Inventors: Suhwan Choi, Suwon-si (KR); Younghun Seo, Suwon-si (KR); Sangyun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 301 days.

(21) Appl. No.: 18/459,266

(22) Filed: Aug. 31, 2023

(65) Prior Publication Data

US 2024/0079047 A1 Mar. 7, 2024

(30) Foreign Application Priority Data

Sep. 1, 2022 (KR) ........................ 10-2022-0111020

(51) Int. Cl.
*G11C 11/406* (2006.01)
*G11C 11/408* (2006.01)
*G11C 11/4091* (2006.01)
*G11C 11/4094* (2006.01)
*G11C 11/4097* (2006.01)
(Continued)

(52) U.S. Cl.
CPC ...... *G11C 11/4085* (2013.01); *G11C 11/4091* (2013.01); *G11C 11/4094* (2013.01); *G11C 11/4097* (2013.01); *G11C 11/4099* (2013.01); *H10B 12/00* (2023.02); *H10B 12/315* (2023.02); *H10B 12/50* (2023.02)

(58) Field of Classification Search
CPC ............ G11C 11/4085; G11C 11/4091; G11C 11/4097; G11C 11/4099; G11C 11/406; G11C 11/4094; H10B 12/00; H10B 12/315; H10B 12/50
See application file for complete search history.

(56) References Cited

U.S. PATENT DOCUMENTS 5,448,516 A * 9/1995 Tsukikawa ............. G11C 5/025 365/182
7,598,571 B2 10/2009 Kim et al.
(Continued)

FOREIGN PATENT DOCUMENTS

| JP | H09-311432 A | 12/1997 |
|---|---|---|
| KR | 100640653 B1 | 11/2006 |
| KR | 10-2021-0007739 A | 1/2021 |

*Primary Examiner* — Mushfique Siddique
(74) *Attorney, Agent, or Firm* — Wolf, Greenfield & Sacks, P.C.

(57) ABSTRACT

A memory device includes a plurality of sub-array areas each including a plurality of memory cells, a plurality of contact areas located between the plurality of sub-array areas, a plurality of word lines each extending in a first direction to cross the plurality of sub-array areas and the plurality of contact areas, and a plurality of sub-word line drivers beneath the plurality of sub-array areas and configured to drive the plurality of word lines, wherein each of the plurality of contact areas comprises a plurality of contacts electrically connecting a corresponding word line, among the plurality of word lines, to a sub-word line driver.

20 Claims, 20 Drawing Sheets

(51) Int. Cl.

| | |
|---|---|
| ***G11C 11/4099*** | (2006.01) |
| ***H10B 12/00*** | (2023.01) |

(56) References Cited

U.S. PATENT DOCUMENTS

| | | | | |
|---|---|---|---|---|
| 9,735,354 | B2 | 8/2017 | Redaelli et al. | |
| 11,031,405 | B2 | 6/2021 | Fardad et al. | |
| 2005/0001257 | A1 | 1/2005 | Schloesser et al. | |
| 2012/0327714 | A1 | 12/2012 | Lue | |
| 2014/0010032 | A1* | 1/2014 | Seshadri | G11C 7/227 365/230.06 |
| 2014/0054718 | A1 | 2/2014 | Karda et al. | |
| 2020/0312853 | A1* | 10/2020 | Choi | H10B 12/03 |
| 2022/0084578 | A1* | 3/2022 | Li | G11C 11/4093 |
| 2024/0107753 | A1* | 3/2024 | Lim | H10B 12/50 |
| 2024/0290375 | A1* | 8/2024 | Simsek-Ege | G11C 5/025 |
| 2024/0431122 | A1* | 12/2024 | Lee | H10B 80/00 |
| 2025/0174265 | A1* | 5/2025 | Kim | H01L 23/528 |

* cited by examiner

MEMORY DEVICE INCLUDING SUB-WORDLINE DRIVER LOCATED BELOW MEMORY CELL ARRAY AND WORD LINES DRIVEN BY SUB-WORDLINE DRIVER

CROSS-REFERENCE TO RELATED APPLICATION

This application is based on and claims priority under 35 U.S.C. § 119 to Korean Patent Application No. 10-2022-0111020, filed on Sep. 1, 2022, in the Korean Intellectual Property Office, the disclosure of which is incorporated by reference herein in its entirety.

BACKGROUND

The inventive concept relates to semiconductor memory devices, and more particularly, to a memory device including a memory cell array and a sub-word line driver located below the memory cell array.

Dynamic random access memory (DRAM) operates by writing and reading data using electric charges stored in cell capacitors of memory cells. In DRAM, a memory cell array is connected to bit lines and word lines. The plurality of bit lines are connected to a sense amplifier and the word lines are connected to a word line driver.

It is desired to reduce the size of a memory device without compromising the performance of the memory device.

SUMMARY

The inventive concept may provide a memory device including a plurality of sub-word line drivers located below a memory cell array and having improved word line driving force due to word lines extending to be driven by a plurality of sub-word line drivers.

According to an aspect of the inventive concept, there is provided a memory device including a plurality of sub-array areas each including a plurality of memory cells, a plurality of contact areas located between the plurality of sub-array areas, a plurality of word lines each extending in a first direction to cross the plurality of sub-array areas and the plurality of contact areas, and a plurality of sub-word line drivers beneath the plurality of sub-array areas and configured to drive the plurality of word lines, wherein each of the plurality of contact areas comprises a plurality of contacts electrically connecting a corresponding word line, among the plurality of word lines, to a sub-word line driver.

According to another aspect of the inventive concept, there is provided a memory device including a memory cell area comprising a memory array including a plurality of memory cells and a peripheral circuit area beneath the memory cell area and including a peripheral circuit, wherein the memory cell area further comprises: a plurality of sub-array areas each including the plurality of memory cells, a plurality of contact areas located between the plurality of sub-array areas, and a plurality of word lines each extending in a first direction to cross the plurality of sub-array areas and the plurality of contact areas, wherein, the plurality of contact areas include a plurality of contacts electrically connecting the plurality of word lines to the peripheral circuit.

According to another aspect of the inventive concept, there is provided a memory device including a plurality of sub-array areas each including a plurality of memory cells, a plurality of contact areas located between the plurality of sub-array areas, a plurality of word lines each extending in a first direction, and a plurality of sub-word line drivers beneath the plurality of sub-array areas and configured to drive the plurality of word lines, wherein each of the plurality of contact areas comprises a plurality of contacts electrically connecting a corresponding word line, among the plurality of word lines, to a sub-word line driver, and wherein each of the plurality of word lines is connected to at least two corresponding sub-word line drivers, among the plurality of sub-word line drivers.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
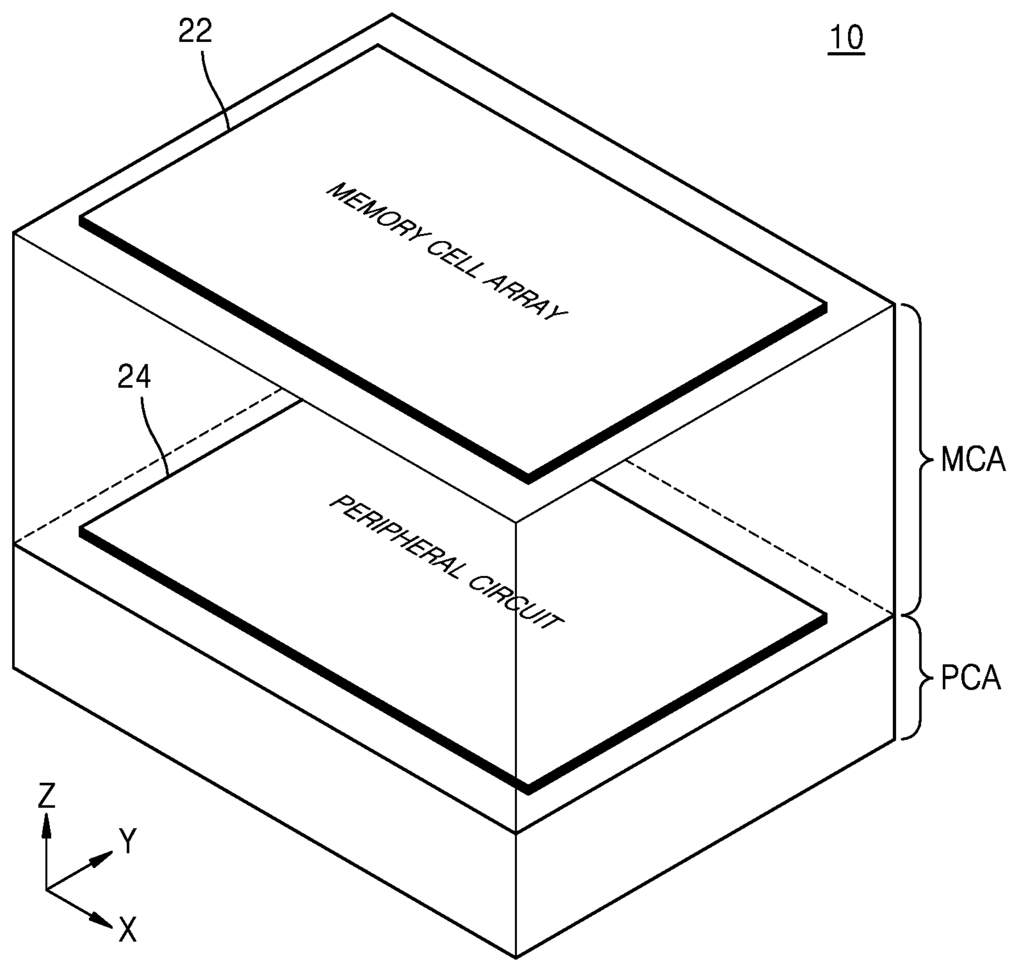
FIG. 1 is a diagram schematically illustrating a structure of a memory device according to an embodiment.

Hereinafter, embodiments are described in detail with reference to the accompanying drawings. The same reference numerals are used for the same components in the drawings, and redundant descriptions thereof are omitted. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 2:
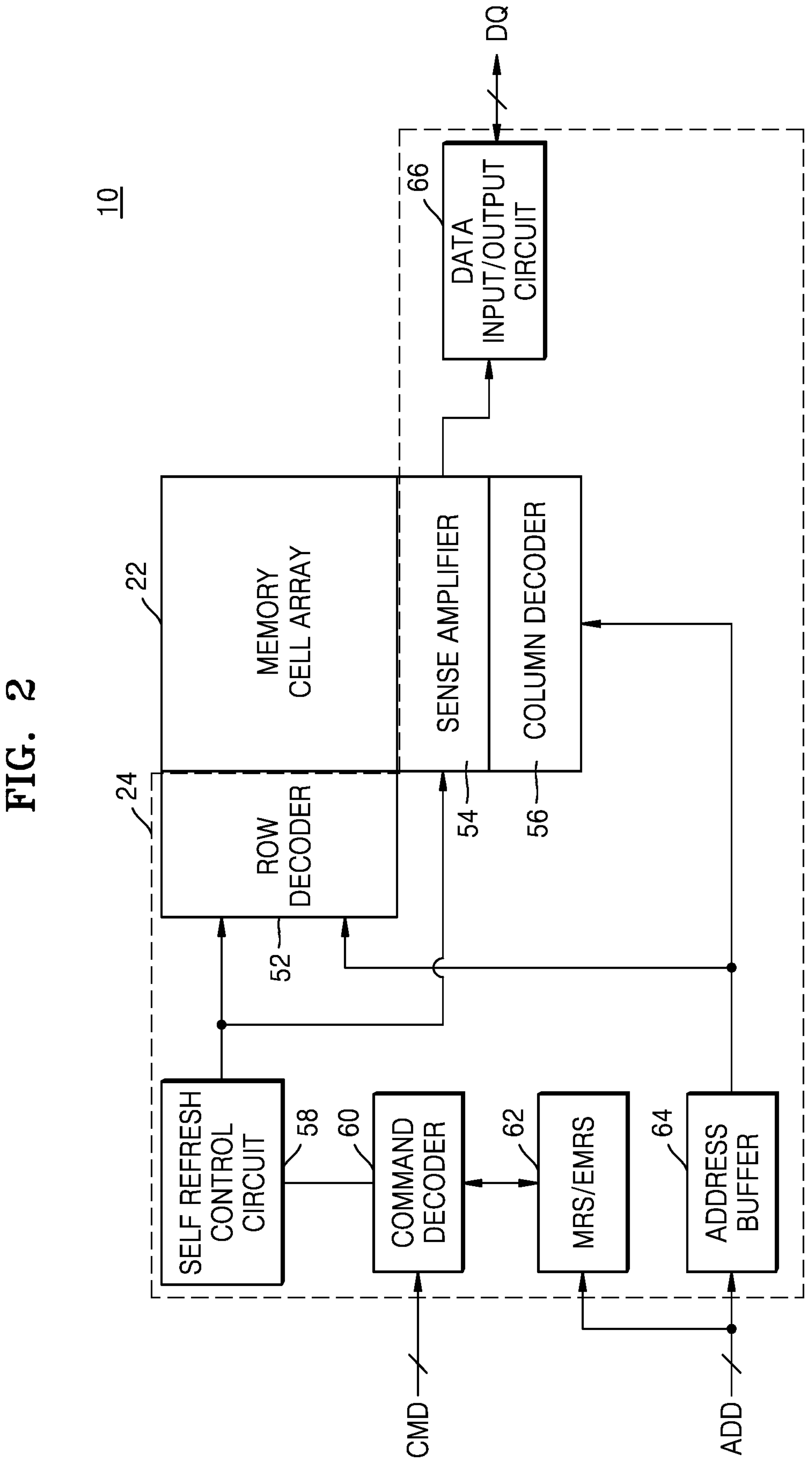
FIG. 2 is a block diagram illustrating a configuration of a memory device according to an embodiment.

FIG. 1 is a diagram schematically illustrating the structure of a memory device 10 according to an embodiment. FIG. 2 is a block diagram illustrating a configuration of the memory device 10 according to an embodiment.

The memory device 10 may correspond to, for example, but not limited to, double data rate synchronous dynamic random access memory (DDR SDRAM), low power double data rate (LPDDR) SDRAM, graphics double data rate (GDDR) SDRAM, rambus dynamic random access memory (RDRAM), etc. In other embodiments, the memory device 10 may be implemented as, for example, but not limited to, static RAM (SRAM), high bandwidth memory (HBM), or processor-in-memory (PIM). According to some embodiments, the memory device 10 may be implemented as a non-volatile memory device. For example, the memory device 10 may be implemented as a flash memory or a resistive memory, such as phase change RAM (PRAM), magnetic RAM (MRAM), or resistive RAM (RRAM).

Referring to FIG. 1, the memory device 10 may include a memory cell area MCA and a peripheral circuit area PCA. The memory cell area MCA may be disposed on the peripheral circuit area PCA in a vertical direction (e.g., a Z direction). That is, the peripheral circuit area PCA may be disposed to be buried under the memory cell area MCA in the vertical direction.

A memory cell array 22 may be formed in the memory cell area MCA, and at least some of the peripheral circuits 24 may be formed in the peripheral circuit area PCA. For example, the sub-word line driver, a sub-row decoder, a sub-sense amplifier, and a power control circuit may be located in the peripheral circuit area PCA formed under the memory cell area MCA. The sub-word line driver and the sub-row decoder may be included in a row decoder 52 of FIG. 2, and the sub-sense amplifier and the power control circuit may be included in a sense amplifier 54 of FIG. 2.

Referring to FIGS. 1 and 2, the memory cell array 22 may include a plurality of memory cells arranged in rows and columns. The memory cell array 22 may include a plurality of word lines and a plurality of bit lines connected to the memory cells. Each of the memory cells may include a cell transistor and a cell capacitor. A gate of the cell transistor may be connected to a word line corresponding thereto, among the word lines of the memory cell array 22 arranged in a row direction. One end of the cell transistor is connected to a bit line corresponding thereto, among the bit lines of the memory cell array 22 arranged in a column direction. The other end of the cell transistor may be connected to the cell capacitor. The cell capacitor may store charges and may have a capacity corresponding to single bit data (e.g., bit “0” or bit “1”). According to another embodiment, the cell capacitor may store charges and may have a capacity corresponding to multi-bit data (e.g., 2-bit data). The cell capacitor may be restored with an amount of charge corresponding to the capacity of each of single-bit data or multi-bit data.

The peripheral circuit 24 may include a row decoder 52, a sense amplifier 54, a column decoder 56, a self-refresh control circuit 58, a command decoder 60, a mode register set/extended mode register set (MRS/EMRS) circuit 62, an address buffer 64, and a data input/output (I/O) circuit 66.

The sense amplifier 54 may be configured to sense-amplify data of a memory cell and store the data in the memory cell. The sense amplifier 54 may be implemented as a cross-coupled amplifier connected between a bit line and a complementary bit line included in the memory cell array 22. The sense amplifier 54 may be configured to perform control to sequentially perform a pre-charge operation, a charge-sharing operation, a pre-sensing operation, and/or a restore operation to sense data stored in the memory cell.

Data DQ input through the data I/O circuit 66 is written to the memory cell array 22 based on an address signal ADD, and the data DQ read from the memory cell array 22 may be output to the outside (i.e., external to the memory device 10) through the data I/O circuit 66. The address signal ADD may be input to the address buffer 64 to designate a memory cell to and from which data is to be written or read. The address buffer 64 may be configured to temporarily store the externally input address signal ADD.

The row decoder 52 may be configured to decode a row address, among the address signals ADD output from the address buffer 64, to designate a word line connected to a memory cell to or from which data is to be input or output. That is, in a data write or read mode, the row decoder 52 may decode a row address output from the address buffer 64 to enable the corresponding word line. Also, in a self-refresh mode, the row decoder 52 may decode a row address generated by an address counter to enable the corresponding word line.

The column decoder 56 may be configured to decode a column address among the address signals ADD output from the address buffer 64 in order to designate a bit line connected to a memory cell to or from which data is to be input or output. The memory cell array 22 may output data from, or write data to, memory cells designated by row and column addresses.

The command decoder 60 may receive a command signal CMD applied from the outside (i.e., external to the memory device 10), and decode the signal to internally generate a resultant command signal, for example, a self-refresh entry command or a self-refresh exit command.

The MRS/EMRS circuit 62 may be configured to set an internal mode register in response to an MRS/EMRS command for designating an operation mode of the memory device 10 and an address signal ADD. The MRS/EMRS circuit 62 may be programmed to set operating parameters, options, various functions, characteristics and modes of the memory device 10. The MRS/EMRS circuit 62 may be configured to store a parameter code including appropriate bit values that are provided to a command/address (CA) bus of a memory bus when an MRS command is issued from a memory controller coupled to the memory device 10.

For example, the MRS/EMRS circuit 62 may be used to control a burst length, read/write latency, a dynamic voltage, a frequency scaling mode, and the like. The burst length may be provided to set a maximum number of column locations that may be accessed for read and/or write commands. The read/write latency may be provided to define a clock cycle delay between a read and/or write command and a first bit of valid output and/or input data.

The self-refresh control circuit 58 may be configured to control a self-refresh operation of the memory device 10 in response to a command output from the command decoder 60. The command decoder 60 may include an address counter, a timer, and a core voltage generator. The address counter may be configured to generate and apply a row address for designating a row address to be a self-refresh target to the row decoder 52 in response to a self-refresh entry command output from the command decoder 60. The address counter may stop a counting operation in response to a self-refresh end command output from the command decoder 60.

The memory device 10 may further include a clock circuit configured to generate a clock signal, a power generating circuit configured to receive a power supply voltage applied from the outside of the memory device 10 to generate or divide an internal voltage, a voltage detection circuit configured to detect a voltage level, and a control circuit configured to control one or more operations of circuits of the peripheral circuit 24.

Because the memory device 10 according to embodiments of the inventive concept includes the memory cell area MCA and the peripheral circuit area PCA having a stack structure, it may be possible to extend the word lines without interruption by other circuit configurations than memory cells in the memory cell area MCA. The word lines may be connected to a plurality of word line drivers, and a word line driving force may be improved.

Figure 3:
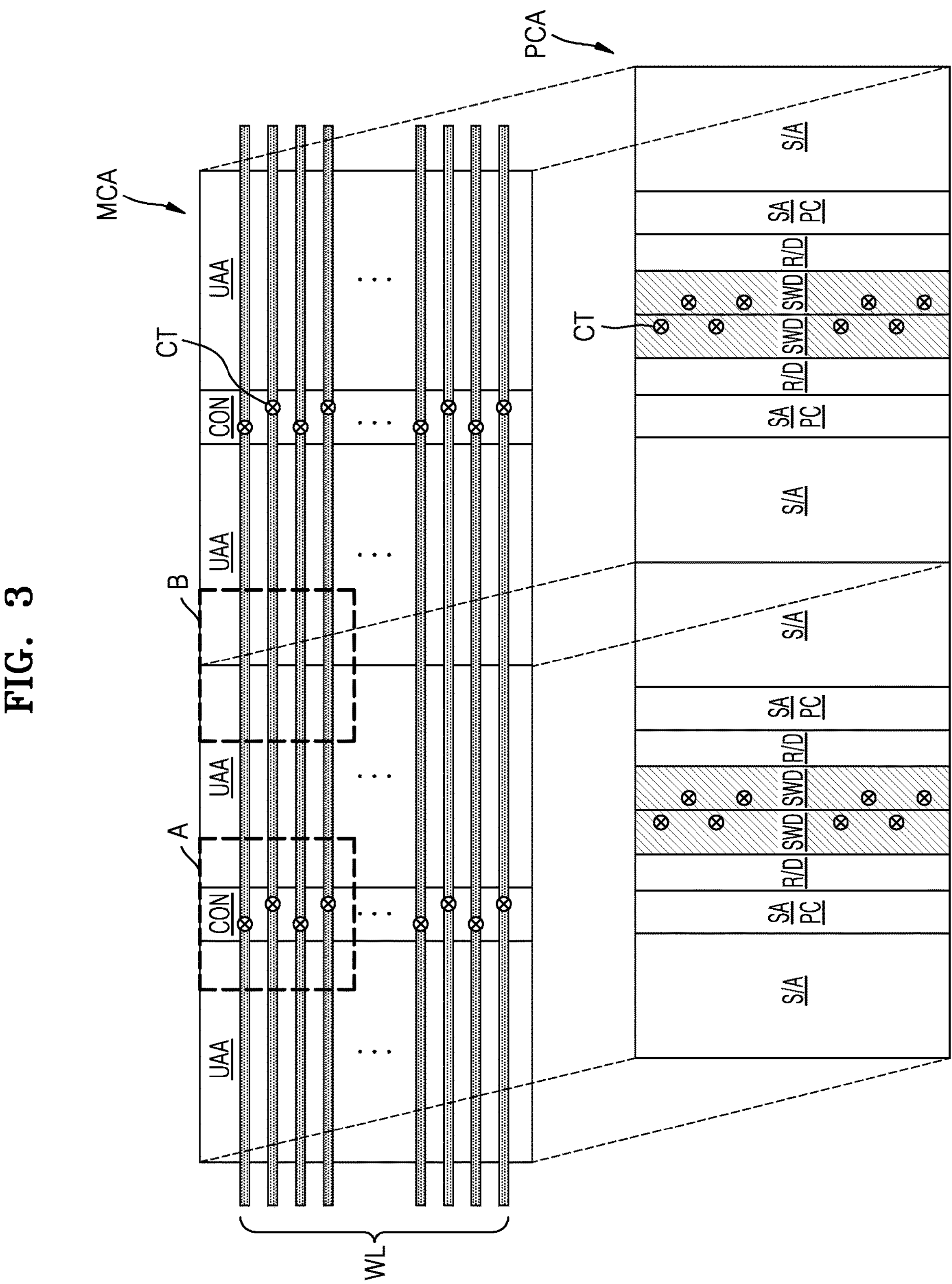
FIG. 3 is a diagram schematically illustrating a structure of a memory cell area and a peripheral circuit area of a memory device according to an embodiment.

FIG. 3 is a diagram schematically illustrating a structure of the memory cell area MCA and the peripheral circuit area PCA of the memory device 10 according to an embodiment.

Referring to FIG. 3, the memory cell area MCA may include a plurality of sub-array areas UAA and a plurality of contact areas CON. A plurality of memory cells may be formed in each of the sub-array areas UAA. In this case, the memory cell may include a cell transistor and a cell capacitor, and each of the memory cells formed in the sub-array areas UAA may include a cell transistor connected to a bit line and a word line, and a cell capacitor.

The memory cell array (e.g., memory cell array 22 of FIG. 2) of the memory device 10 may include a plurality of memory blocks. Memory cells connected to the word lines WL may constitute a single memory block. Each of the sub-array areas UAA may be included in the single memory block and may be a unit array area. At least one surface of each of the sub-array areas UAA may be disposed to be apart from other sub-array areas UAA.

Each of the contact areas CON may be located between two different sub-array areas UAA. A plurality of contacts CT may be located in each of the contact areas CON. The contacts CT may electrically connect the word lines WL to the sub-word line drivers formed in the peripheral circuit area PCA.

A plurality of word lines WL extending on a plane may be located in the memory cell area MCA. For example, the word lines WL may extend in a first horizontal direction (e.g., an X direction of FIG. 1) and may be spaced apart from each other in a second horizontal direction (e.g., a Y direction) to be parallel to each other.

In an embodiment, the word lines WL may extend to cross the sub-array areas UAA and the contact areas CON. Accordingly, each of the word lines WL may be connected to at least two or more corresponding sub-word line drivers, instead of one sub-word line driver, and a driving force for the memory device to drive each of the word lines WL may be improved.

A plurality of contacts CT connected to all of the word lines WL crossing the contact areas CON may be formed in each of the contact areas CON. That is, all of the word lines WL located in two sub-array areas UAA disposed to be adjacent to the contact area CON may be driven through the contacts CT formed in one contact area CON.

The peripheral circuit area PCA may include a plurality of sub-word line driver areas SWD, a plurality of sub-row decoder areas R/D, a plurality of sub-sense amplifier areas S/A, and a plurality of power control circuit areas SAPC. For example, the sub-word line driver area SWD, the sub-row decoder area R/D, the power control circuit area SAPC, and the sub-sense amplifier area S/A corresponding to one sub-array area UAA may be sequentially arranged on a plane. A sub-word line driver may be formed in each of the sub-word line driver areas SWD, a sub-row decoder may be formed in each of the sub-row decoder areas R/D, a sub-sense amplifier may be formed in each of the sub-sensing amplifier areas S/A, and a power control circuit may be formed in each of the power control circuit areas SAPC. A plurality of local sense amplifiers and a plurality of bit line sense amplifiers may be formed in each of the sub-sense amplifier areas S/A.

In an embodiment, the sub-word line driver areas SWD may be located below the sub-array areas UAA and/or the contact areas CON (e.g., in the vertical direction (e.g., the Z direction)). Each of the sub-word line driver areas SWD may be located below a corresponding contact area among the contact areas CON and may be connected to the contacts CT. A sub-word line driver formed in each of the sub-word line driver areas SWD may be referred to as a buried sub-word line driver. The sub-word line driver may be configured to select and drive the word line WL connected through the contacts CT.

Two sub-word line driver areas SWD may be located below each of the contact areas CON. Sub-word line drivers formed in one of two sub-word line driver areas SWD located below the contact area CON may be configured to drive some of the word lines WL, and sub-word line drivers formed in the other of the two sub-word line driver areas SWD may be configured to drive some other ones of the word lines WL.

The sub-row decoder may be connected to the sub-word line driver. The sub-row decoder may be configured to generate a word line driving voltage to apply a word line driving voltage to a word line corresponding to an address.

The sub-sense amplifier may be connected to bit lines formed in the sub-array areas UAA, and may be configured to read data from or write data to memory cells formed in the sub-array areas UAA. The sub-sense amplifier may be referred to as a buried sense amplifier. The power control circuit may be configured to provide power to the sub-sense amplifier or a signal to the sub-sense amplifier.

Figure 4:
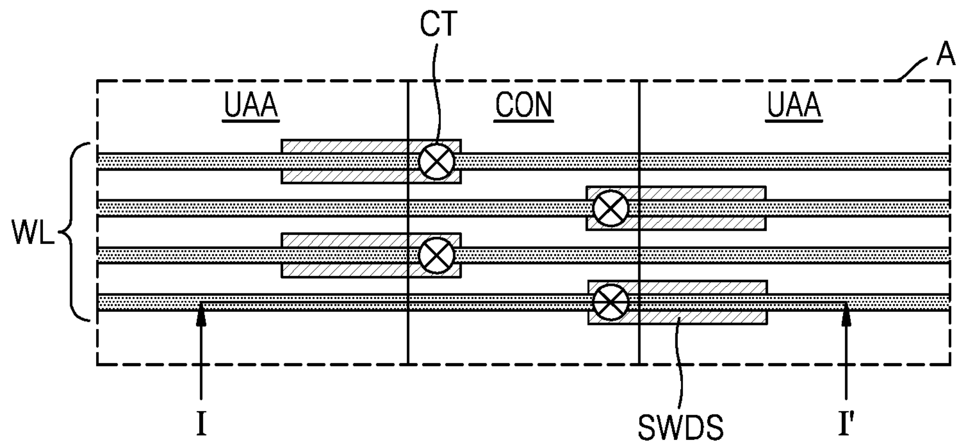
FIG. 4 is an enlarged cross-sectional view of a portion "A" in FIG. 3.
Figure 5:
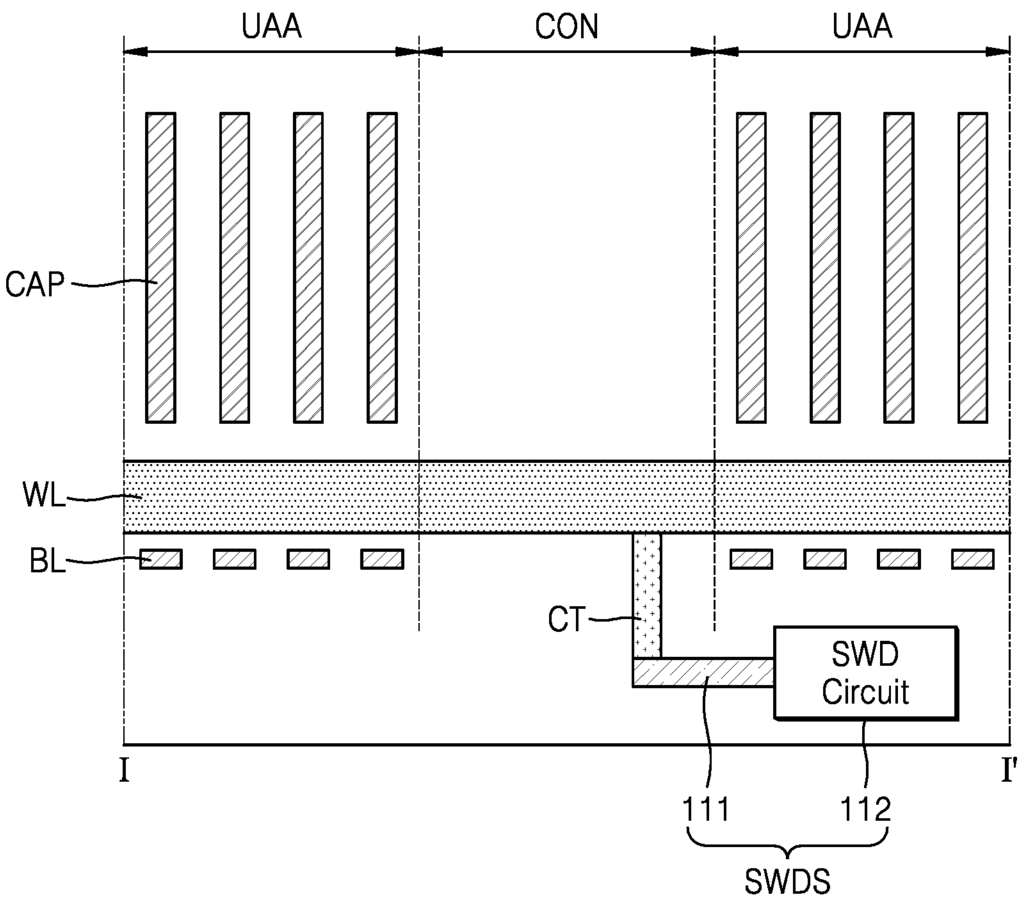
FIGS. 5 to 7 are cross-sectional views taken along line I-I' of FIG. 4.
Figure 6:
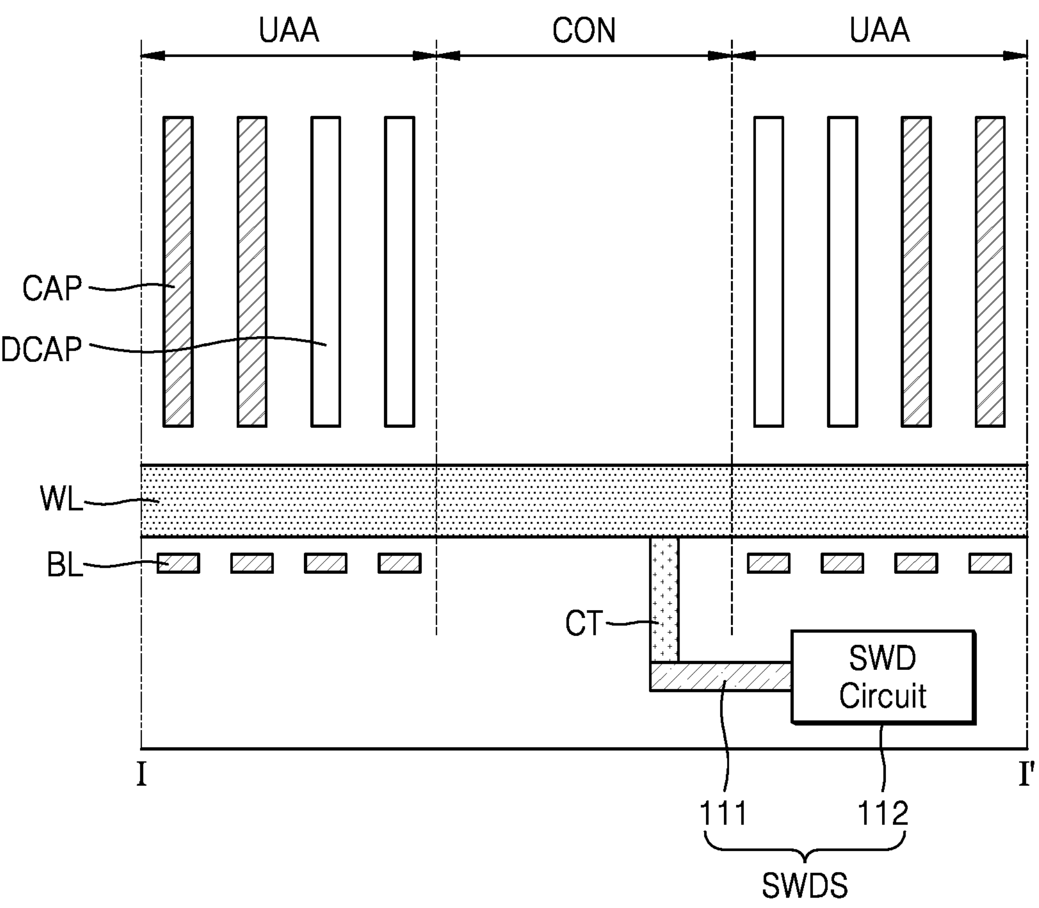
Figure 7:
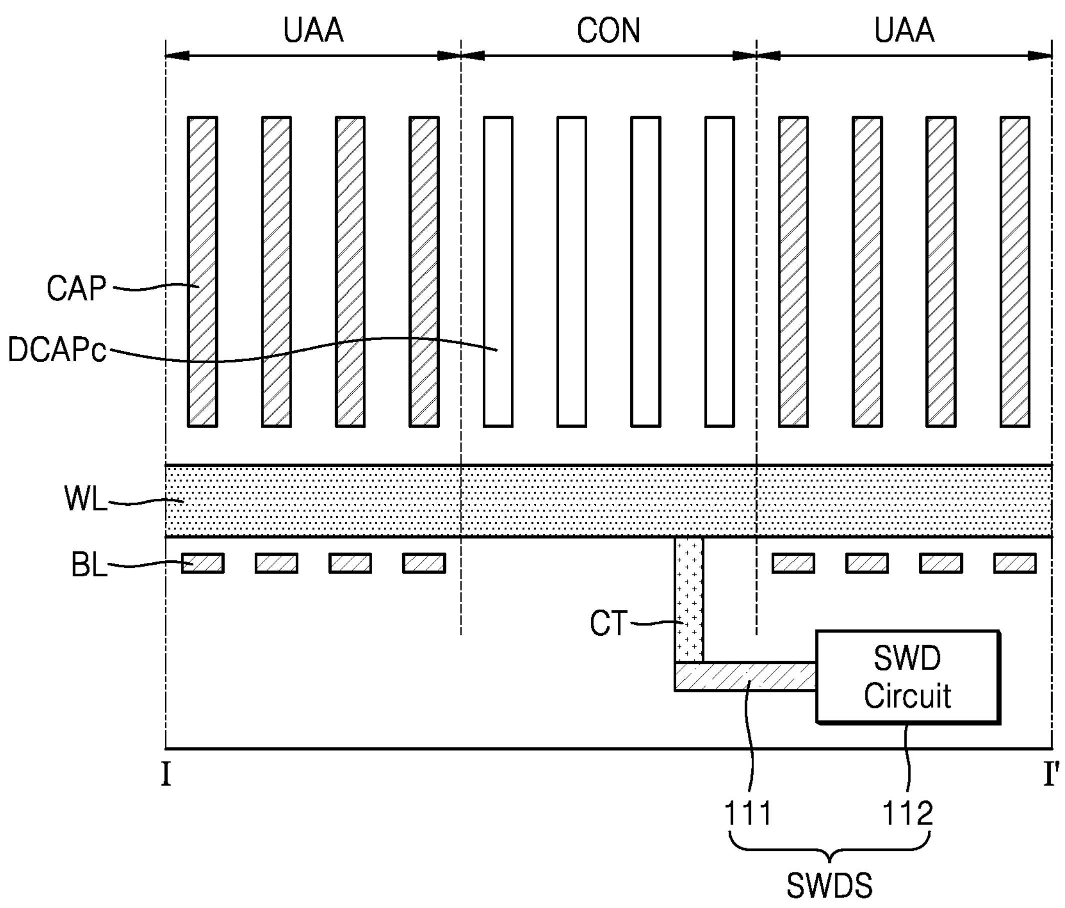

FIG. 4 is an enlarged cross-sectional view of the portion "A" in FIG. 3. FIGS. 5 to 7 are cross-sectional views taken along line I-I' of FIG. 4. A more detailed description of the cross-section of the memory device 10 according to embodiments of the inventive concept is given below with reference to FIGS. 15A and 15B.

Referring to FIGS. 4 and 5, the word lines WL may extend in the first horizontal direction (e.g., X direction in FIG. 1) and may be spaced apart from each other and arranged in parallel to each other in the second horizontal direction (the Y direction). The bit lines BL may extend in the second horizontal direction and may be spaced apart from each other and arranged in parallel to each other in the first horizontal direction.

The sub-word line circuit units SWDS may be located below a layer in which the word lines WL are formed. Each of the word lines WL may be connected to a sub-word line circuit (i.e., SWC circuit) 112 corresponding thereto through the contacts CT extending in the vertical direction and a conductive line 111 extending in a horizontal direction. In FIG. 4, for convenience of illustration, it is illustrated that the contacts CT are disposed on the word lines WL, but the contacts CT may be located below the word lines WL.

In an embodiment, the sub-word line circuit unit SWDS connected to odd-numbered word lines among the word lines WL may be located to be parallel in a direction perpendicular to a direction in which the word lines WL extend, for example, in the second horizontal direction. In addition, the sub-word line circuit units SWDS connected to even-numbered word lines among the word lines WL may be arranged to be parallel in the second horizontal direction. The sub-word line circuit units SWDS connected to odd-numbered word lines and the sub-word line circuit units SWDS connected to even-numbered word lines are not parallel to each other and may not overlap each other in the second horizontal direction. However, the arrangement of the sub-word line circuit units SWDS shown in FIG. 4 is an example, and in the memory device 10 according to embodiments of the inventive concept, the sub-word line circuit units SWDS connected to each of the word lines adjacent thereto may not be parallel to each other and may not overlap each other in the second horizontal direction.

A plurality of cell capacitor structures CAP may be formed in the sub-array area UAA. The cell capacitor structures CAP may not, however, be formed in the contact area CON. That is, the cell capacitor structures CAP may be formed only in the sub-array areas UAA, among the sub-array areas UAA and the contact areas CON. For example, a separation space between the cell capacitor structures CAP may include the contact areas CON.

In addition, a plurality of bit lines BL may be formed in the sub-array area UAA, while no bit lines BL may be formed in the contact area CON. That is, the bit lines BL may be formed only in the sub-array areas UAA, among the sub-array areas UAA and the contact areas CON. Each component constituting the cell transistor may be formed in the sub-array area UAA, but at least one of the components constituting the cell transistor may not be formed in the contact area CON. For example, a separation space between the bit lines BL may include the contact areas CON.

Because the memory device 10 according to embodiments of the inventive concept includes the word lines WL continuously extending without being disconnected in the contact area CON, a word line driving force may be improved. In addition, in the memory device 10 according to embodiments of the inventive concept, because peripheral circuits 24 are located below the memory cell array 22, it is not necessary to form a direct contact connected to an upper metal layer of the memory cell array 22 between two different sub-array areas UAA to provide signals to the peripheral circuits 24. Therefore, in the memory device 10, plate poly that is formed to at least partially cover the cell capacitor structures CAP and applies a voltage to one end of the cell capacitors formed at each of the cell capacitor structures CAP may be formed to at least partially cover two different sub-array areas UAA, without interruption between the two sub-array areas UAA. A size of an area (e.g., the contact area CON) between two different sub-array areas UAA may be reduced, and a size of the memory device 10 may be reduced. Here, the plate poly may include, for example, SiN.

Referring to FIG. 6, at least one dummy capacitor structure DCAP may be formed in an edge area close to the contact area CON of the sub-array area UAA. Dummy memory cells may be formed in an edge area of the sub-array area UAA close to the contact area CON. In this case, a bit line BL may be formed below the dummy capacitor structure DCAP.

The edge of the sub-array area UAA may get closer to the contact area CON where capacitor structures (e.g., CAP or DCAP) are not formed, and the capacitor structures located at the edge of the sub-array area UAA may not satisfy desired characteristics requirements due to a more difficult fabrication process. As a result, the performance of memory cells formed at the edge of the sub-array area UAA may deteriorate. Therefore, dummy cells including the dummy capacitor structure DCAP may be provided in the edge area relatively close to the contact area CON of the sub-array area UAA to satisfy the performance characteristics required for the memory cell included in the memory device to operate in a desired fashion.

Referring to FIG. 7, a plurality of dummy capacitor structures DCAPc may be formed in the contact area CON. In an embodiment, bit lines BL may not be formed below the dummy capacitor structures DCAPc.

Because the dummy capacitor structures DCAPc are also formed between two different sub-array areas UAA, the capacitor structures (e.g., CAP or DCAP) may be formed at regular intervals in the sub-array areas UAA and the contact areas CONS. Accordingly, deterioration of memory cells formed in the sub-array area UAA may be reduced or prevented.

Figure 8:
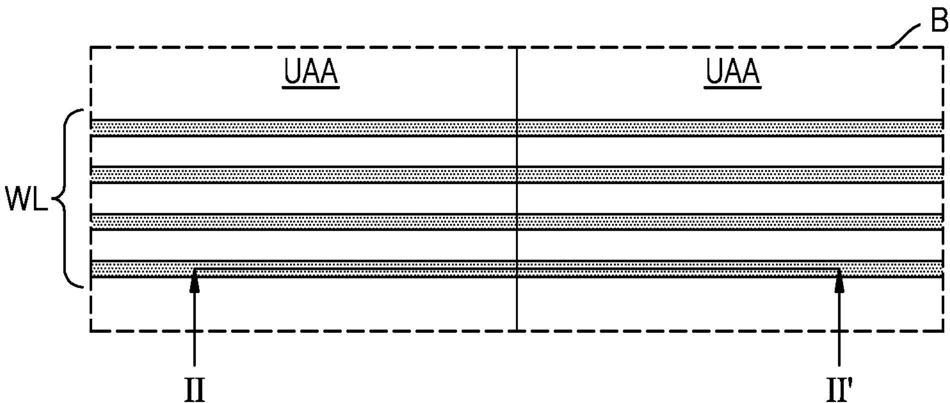
FIG. 8 is an enlarged cross-sectional view of a portion "B" in FIG. 3.
Figure 9:
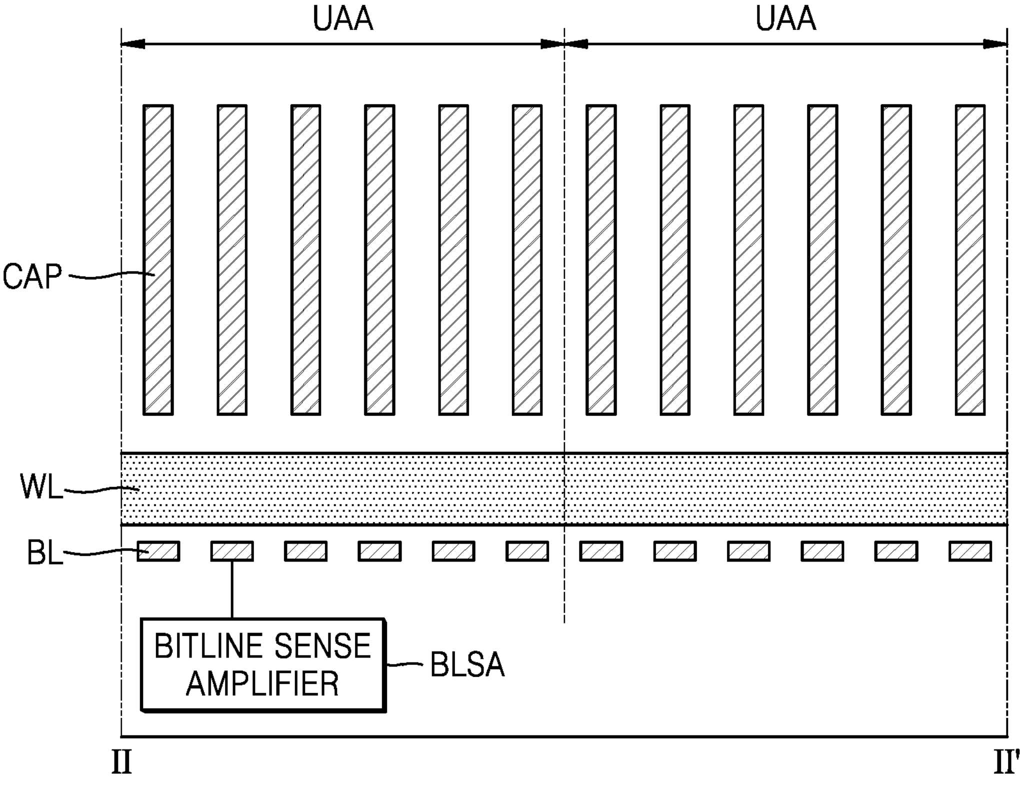
FIG. 9 is a cross-sectional view taken along line II-IT of FIG. 8.

FIG. 8 is an enlarged cross-sectional view of portion “B” in FIG. 3. FIG. 9 is a cross-sectional view taken along line II-IT of FIG. 8.

Referring to FIGS. 8 and 9, one subarray area UAA may be in contact with a contact area (e.g., CON in FIG. 3) on one surface, and may be in contact with another sub-array area UAA on another surface opposing the one surface. A plurality of cell capacitor structures CAP may be continuously located in the two sub-array areas UAA located to be in contact with each other. The cell capacitor structures CAPs formed in the two sub-array areas UAA that are in contact with each other may be spaced apart from each other at regular intervals.

The word lines WL may extend in the first horizontal direction without being disconnected in two sub-array areas UAA that are in contact with each other. The bit lines BL may extend in a second horizontal direction perpendicular to the first horizontal direction.

The bit line sense amplifier BLSA may be buried and located below a layer in which the bit lines BL are formed. The bit line sense amplifier BLSA may be connected to a corresponding bit line pair, among the bit lines BL, may be configured to amplify a difference in voltage level sensed in the bit line pair, and be configured to transmit the amplified difference in voltage level to a local I/O line pair. A local sense amplifier located in the sub-sense amplifier area may be configured to control a connection between the local I/O line pair and global I/O lines.

Figure 10:
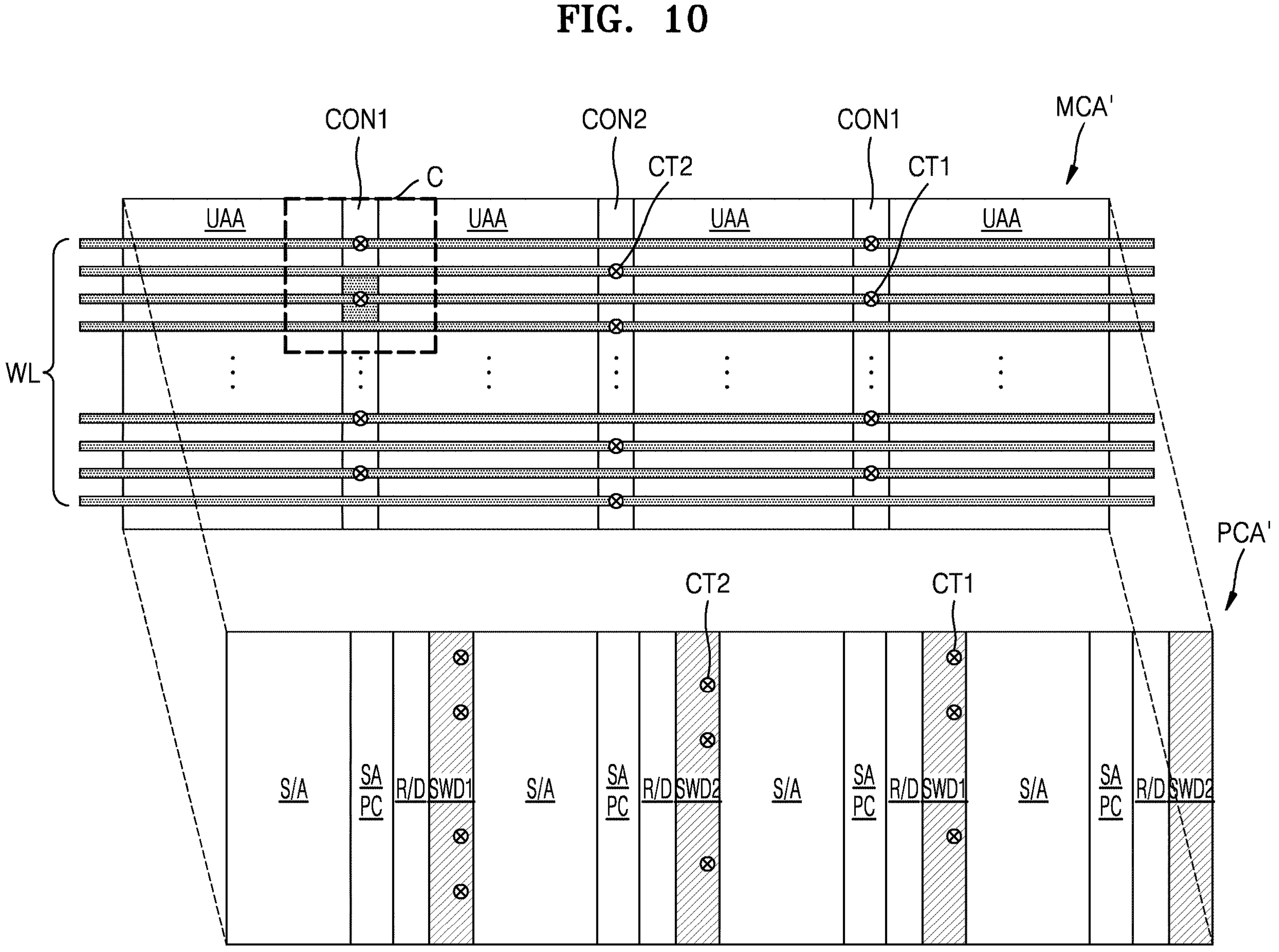
FIG. 10 is a diagram schematically illustrating a structure of a memory cell area and a peripheral circuit area of a memory device according to an embodiment.
Figure 11:
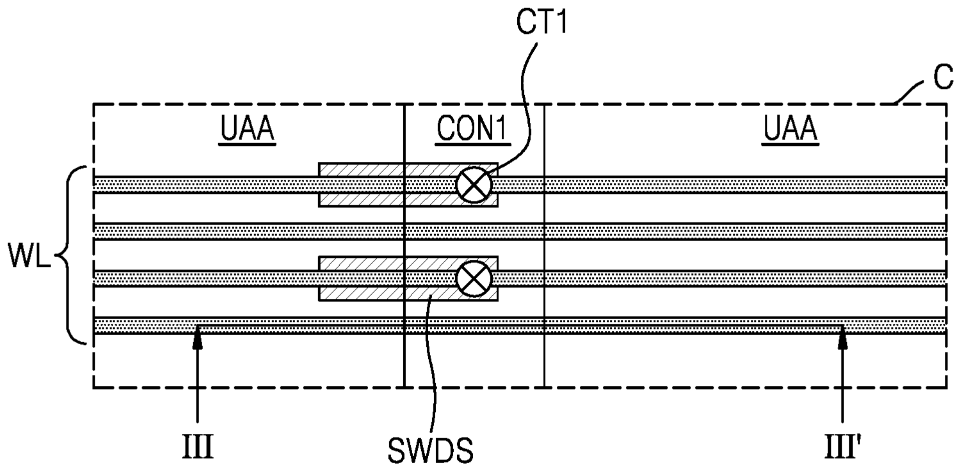
FIG. 11 is an enlarged cross-sectional view of a portion "C" in FIG. 10.
Figure 12:
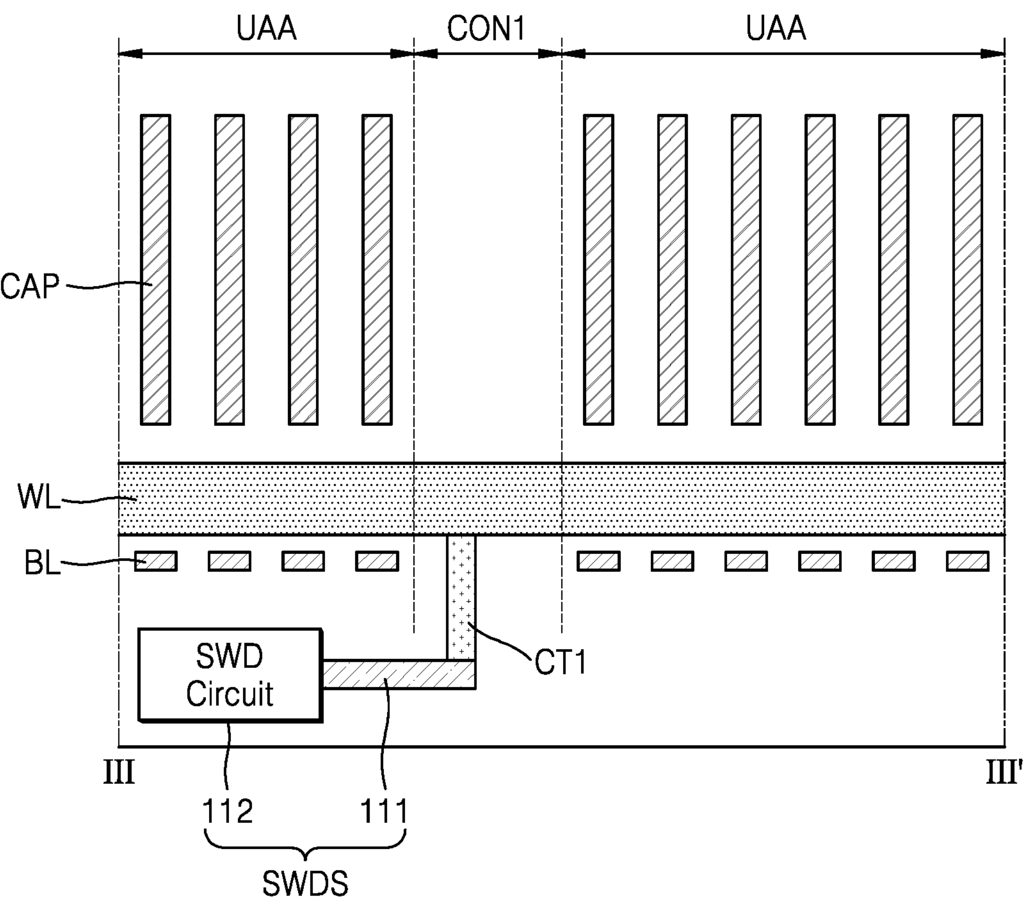
FIG. 12 is a cross-sectional view taken along line III-III' of FIG. 11.

FIG. 10 is a diagram schematically illustrating structures of a memory cell area MCA' and a peripheral circuit area PCA' of the memory device 10 according to an embodiment. FIG. 11 is an enlarged cross-sectional view of a portion “C” in FIG. 10. FIG. 12 is a cross-sectional view taken along line III-III' of FIG. 11. In the description of FIG. 10, redundant descriptions of the same elements as those of FIG. 3 are omitted.

Referring to FIGS. 10 to 12, a memory cell area MCA' may include a plurality of sub-array areas UAA, a plurality of first contact areas CON1, and a plurality of second contact areas CON2. Memory cells may be formed in the sub-array areas UAA. In this case, each of the memory cells formed in the sub-array areas UAA may include cell transistors and cell capacitors connected to bit lines and word lines.

Each of the sub-array areas UAA in the memory cell area MCA' may be spaced apart from other sub-array areas UAA. Each of the sub-array areas UAA may be located such that one surface thereof contacts the first contact area CON1 and the other surface thereof contacts the second contact area CON2. Each of the first contact areas CON1 and the second contact areas CON2 may be located between two different sub-array areas UAA.

A plurality of first contacts CT1 may be located in each of the first contact areas CON1, and a plurality of second contacts CT2 may be located in each of the second contact areas CON2. The first contacts CT1 and the second contacts CT2 may electrically connect the word lines WL to the sub-word line drivers 112 formed in the peripheral circuit area PCA'.

In an embodiment, the word lines WL may extend to cross the sub-array areas UAA, the first contact areas CON1, and the second contact areas CON2. That is, because the memory device 10 includes the word lines WL that are not disconnected in the first contact area CON1 and the second contact area CON2, each of the word lines WL may be connected to the sub-word line drivers 112, rather than a single sub-word line driver 112, and the driving force of each of the word lines WL of the memory device 10 may be improved.

In an embodiment, the first contacts CT1 formed in each of the first contact areas CON1 may be connected to some of the word lines WL, and the second contacts CT2 formed in each of the second contact areas CON2 may be connected to some other ones of the word lines WL. For example, the first contacts CT1 formed in each of the first contact areas CON1 may be connected to odd-numbered word lines, among the word lines WL. The second contacts CT2 formed in each of the second contact areas CON2 may be connected to even-numbered word lines, among the word lines WL.

However, the arrangement of the first contact areas CON1, the second contact areas CON2, the first contacts CT1, and the second contacts CT2 shown in FIG. 10 is an example, and the memory device 10 may include first to n-th contact areas (where n is a natural number of 3 or greater), and contacts connected to corresponding word lines may be formed in each of the first to n-th contact areas. In the memory device 10 according to embodiments of the inventive concept, contacts (e.g., CT1 and CT2) connecting adjacent word lines to the sub-word line circuit unit SWDS may be located in contact areas (e.g., CON1 and CON2) different from each other.

The peripheral circuit area PCA' located below the memory cell area MCA' may include a plurality of first sub-word line driver areas SWD1, a plurality of second sub-word line driver areas SWD2, a plurality of sub-row decoder areas R/D, a plurality of sub-sense amplifier areas S/A, and a plurality of power control circuit areas SAPC. A sub-word line driver may be formed in each of the first sub-word line driver areas SWD1 and the second sub-word line driver areas SWD2. The first sub-word line driver areas SWD1 may be connected to be in contact with the first contacts CT1, and the second sub-word line driver areas SWD2 may be connected to be in contact with the second contacts CT2. For example, the sub-word line driver formed in the first sub-word line driver areas SWD1 may drive odd-numbered word lines, among the word lines WL, and the sub-word line driver formed in the second sub-word line driver areas SWD2 may drive even-numbered word lines, among the word lines WL.

In the memory device 10 according to the inventive concept, because peripheral circuits, such as the sub-word line circuits 112 and the bit line sense amplifiers BLSAs, are located below a memory cell array, there is no need to form a direct contact connected to an upper metal layer of the memory cell array between two different sub-array areas UAA in order to provide signals to the peripheral circuits. Accordingly, the size of the area between the two different sub-array areas UAA (e.g., the first contact area CON1 and the second contact area CON2) may be reduced, and the size of the memory device 10 may be reduced.

Figure 13A:
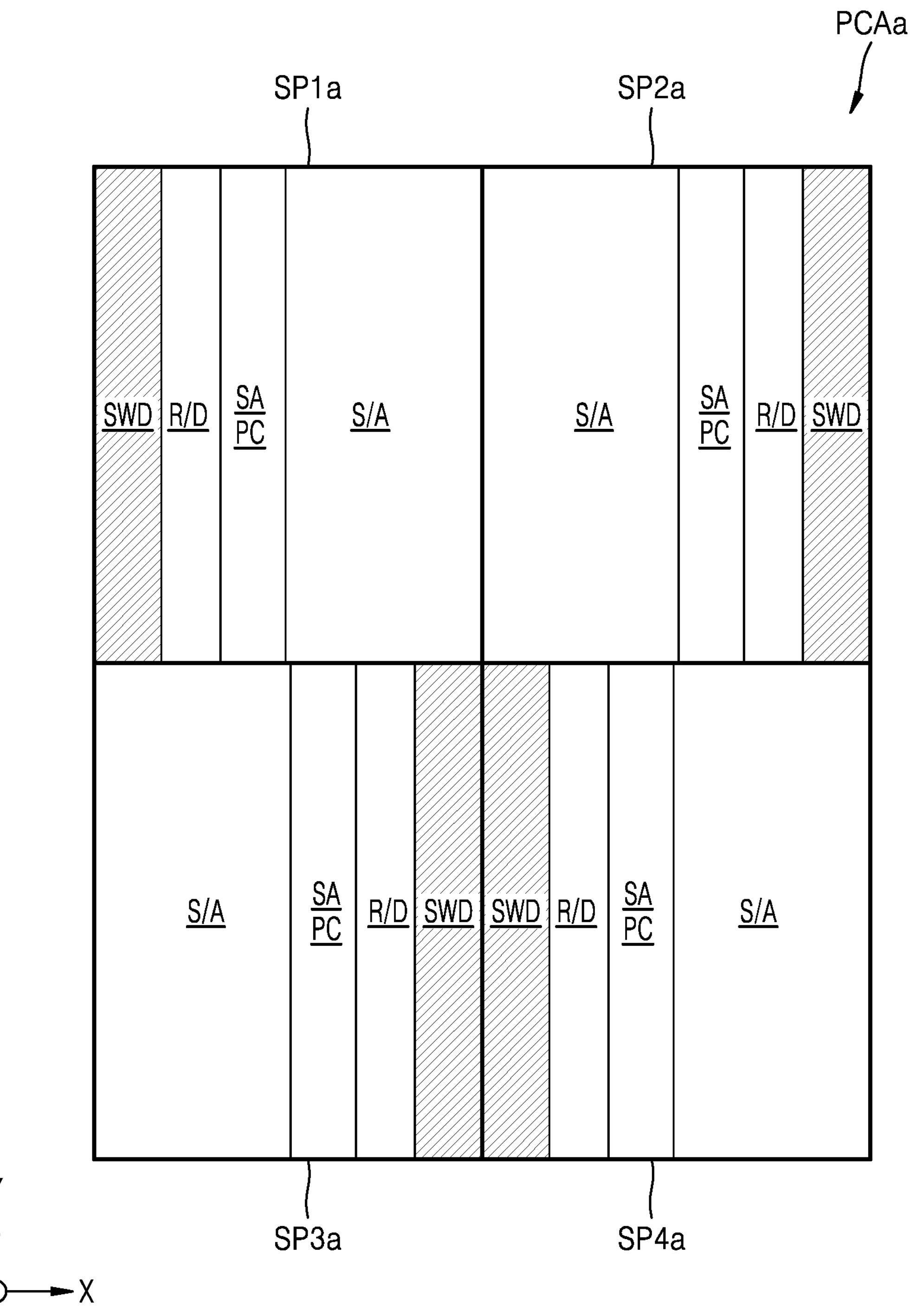
FIGS. 13A to 13D are diagrams schematically illustrating a layout of a peripheral circuit area of a memory device according to an embodiment.
Figure 13B:
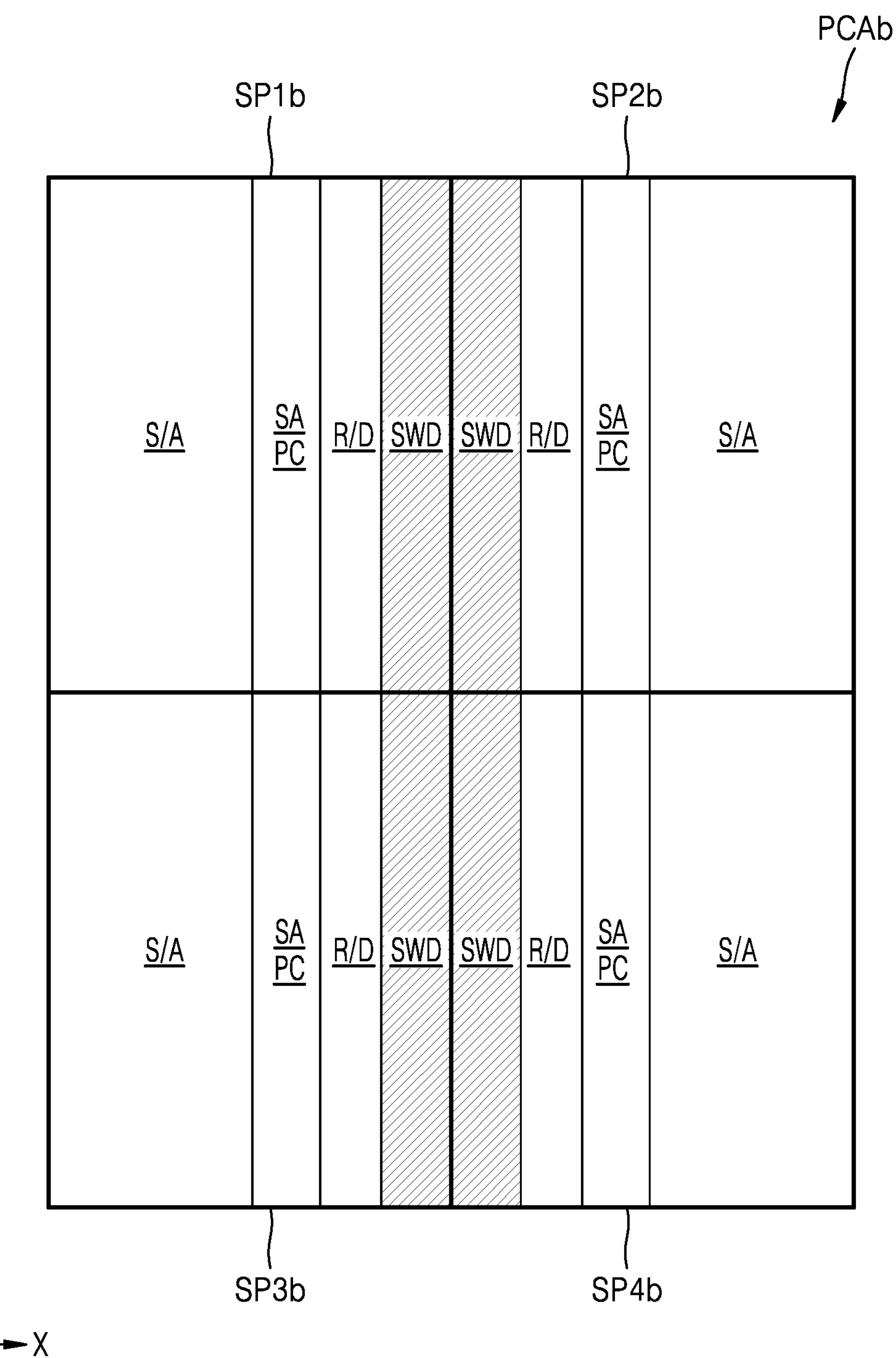
Figure 13C:
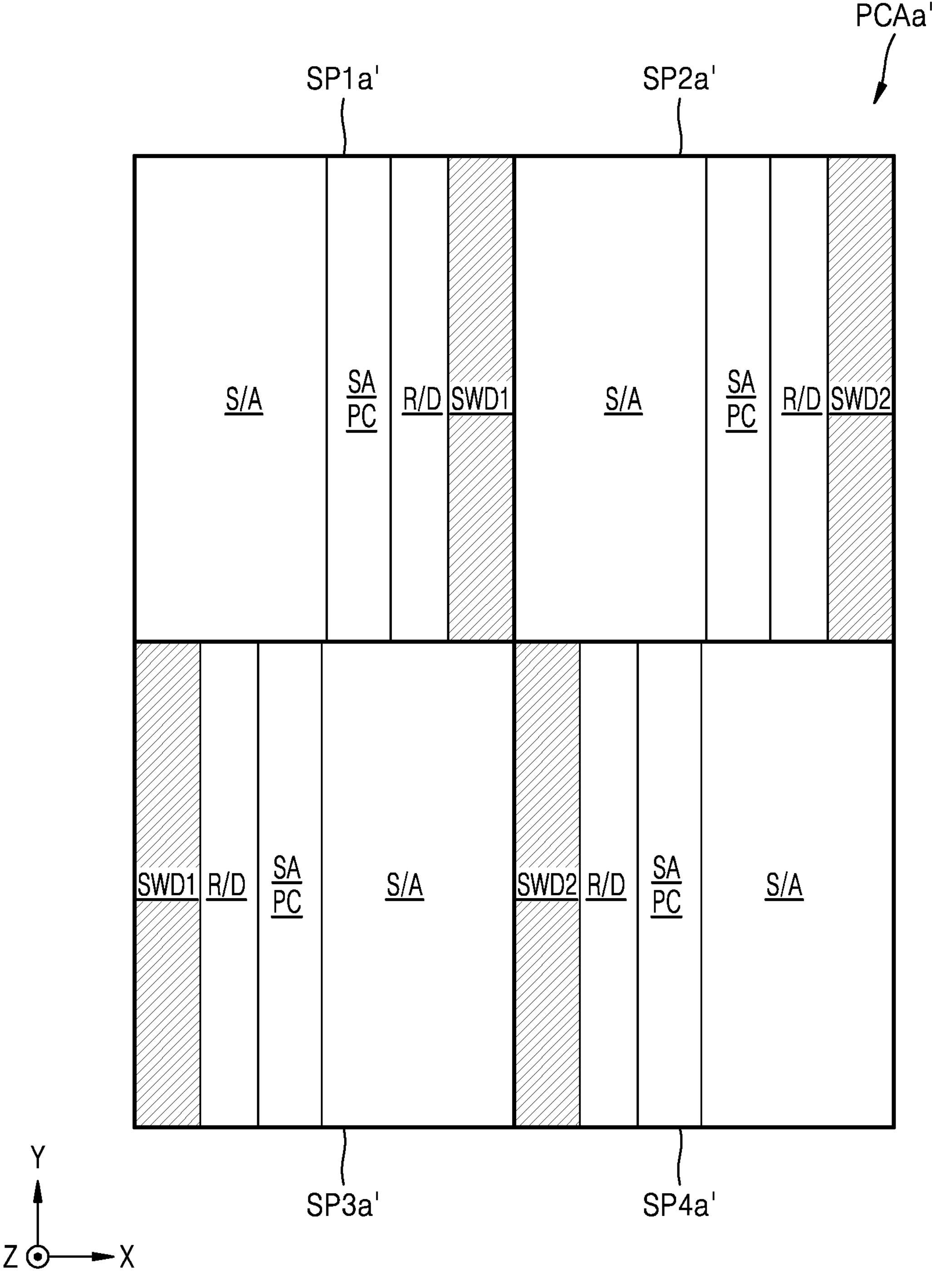
Figure 13D:
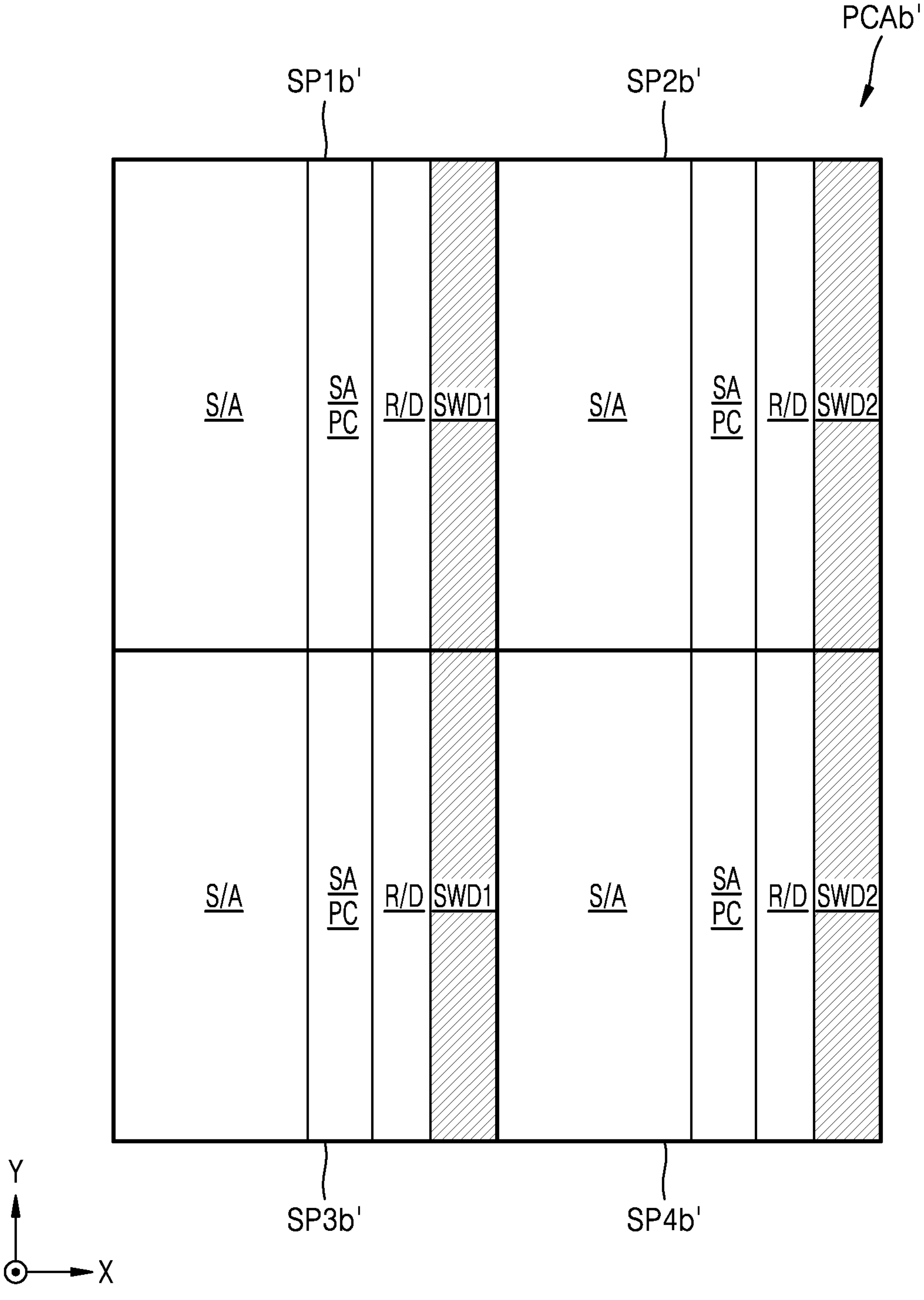

FIGS. 13A to 13D are diagrams schematically illustrating layouts of peripheral circuit areas PCA and PCA' of the memory device 10 according to an embodiment. FIGS. 13A and 13B are examples of the peripheral circuit area PCA of FIG. 3, and FIGS. 13C and 13D are examples of the peripheral circuit area PCA' of FIG. 10. The layouts of the peripheral circuit areas PCA and PCA' according to embodiments of the inventive concept are not limited to those described with reference to FIGS. 13A to 13D and may be variously modified.

Referring to FIG. 13A, a first peripheral circuit area PCAa may include first to fourth sub-circuit areas SP1*a* to SP4*a*. Corresponding sub-array areas may be respectively located on the first to fourth sub-circuit areas SP1*a* to SP4*a*, and the first to fourth sub-circuit areas SP1*a* to SP4*a* may each include a sub-word line driver area SWD, a sub-row decoder area R/D, a sub-sense amplifier area S/A, and a power control circuit area SAPC.

In the first peripheral circuit area PCAa, the sub-sense amplifier area S/A of the first sub-circuit area SP1*a* and the sub-sense amplifier area S/A of the second sub-circuit area SP2*a* located to be adjacent to each other in the first horizontal direction X may be located to contact each other. In addition, in the third sub-circuit area SP3*a* and the fourth sub-circuit area SP4*a* located to be adjacent to the first sub-circuit area SP1*a* and the second sub-circuit area SP2*a* in the second horizontal direction (e.g., the Y direction), respectively, the sub-word line driver area SWD of the third sub-circuit area SP3*a* and the sub-word line driver area SWD of the fourth sub-circuit area SP4*a* may be disposed to contact each other.

In an embodiment, the sub-word line driver area SWD of the first sub-circuit area SP1*a* may be electrically connected to some (e.g., even-numbered word lines) of the word lines extending on the first sub-circuit area SP1*a* and the second sub-circuit area SP2*a*. The sub-word line driver area SWD of the second sub-circuit area SP2*a* may be electrically connected to some other ones (e.g., the odd-numbered word lines) of the word lines extending on the first sub-circuit area SP1*a* and the second sub-circuit area SP2*a*.

In an embodiment, the sub-word line driver area SWD of the third sub-circuit area SP3*a* may be electrically connected to some (e.g., odd-numbered word lines) of the word lines extending on the third sub-circuit area SP3*a* and the fourth sub-circuit area SP4*a*. The sub-word line driver area SWD of the fourth sub-circuit area SP4*a* may be electrically connected to some other ones (e.g., even-numbered word lines) of the word lines extending on the third sub-circuit area SP3*a* and the fourth sub-circuit area SP4*a*.

Referring to FIG. 13B, the second peripheral circuit area PCAb may include first to fourth sub-circuit areas SP1*b* to SP4*b*. Corresponding sub-array areas may be respectively located on the first to fourth sub-circuit areas SP1*b* to SP4*b*, and the first to fourth sub-circuit areas SP1*b* to SP4*b* may each include a sub-word line driver area SWD, a sub-row decoder area R/D, a sub-sense amplifier area S/A, and a power control circuit area SAPC.

In the second peripheral circuit area PCAb, the sub-word line driver area SWD of the first sub-circuit area SP1*b* and the sub-word line driver area SWD of the second sub-circuit area SP2*b* located to be adjacent to each other in the first horizontal direction X may be located to contact each other. In addition, in the third sub-circuit area SP3*b* and the fourth sub-circuit area SP4*b* located to be adjacent to the first sub-circuit area SP1*b* and the second sub-circuit area SP2*b* in the second horizontal direction (the Y direction), respectively, the sub-word line driver area SWD of the third sub-circuit area SP3*b* and the sub-word line driver area SWD of the fourth sub-circuit area SP4*b* may be disposed to contact each other.

In an embodiment, the sub-word line driver area SWD of the first sub-circuit area SP1*b* may be electrically connected to some (e.g., the odd-numbered word lines) of the word lines extending on the first sub-circuit area SP1*b* and the second sub-circuit area SP2*b*. The sub-word line driver area SWD of the second sub-circuit area SP2*b* may be electrically connected to some other ones (e.g., the even-numbered word lines) of the word lines extending on the first sub-circuit area SP1*b* and the second sub-circuit area SP2*b*.

In an embodiment, the sub-word line driver area SWD of the third sub-circuit area SP3*b* may be electrically connected to some (e.g., odd-numbered word lines) of the word lines extending on the third sub-circuit area SP3*b* and the fourth sub-circuit area SP4*b*. The sub-word line driver area SWD of the fourth sub-circuit area SP4*b* may be electrically connected to some other ones (e.g., even-numbered word lines) of the word lines extending on the third sub-circuit area SP3*b* and the fourth sub-circuit area SP4*b*.

Referring to FIG. 13C, the third peripheral circuit area PCAa' may include first to fourth sub-circuit areas SP1*a*' to SP4*a*'. Corresponding sub-array areas may be respectively located on the first to fourth sub-circuit areas SP1*a*' to SP4*a*', and the first to fourth sub-circuit areas SP1*a*' to SP4*a*' may each include a sub-word line driver area SWD, a sub-row decoder area R/D, a sub-sense amplifier area S/A, and a power control circuit area SAPC.

The first sub-word line driver area SWD1 of the first sub-circuit area SP1*a*' may be electrically connected to some (e.g., the odd-numbered word lines) of the word lines extending on the first sub-circuit area SP1*a*' and the second sub-circuit area SP2*a*'. The second sub-word line driver area SWD2 of the second sub-circuit area SP2*a*' may be electrically connected to some other ones (e.g., the even-numbered word lines) of the word lines extending on the first sub-circuit area SP1*a*' and the second sub-circuit area SP2*a*'.

The first sub-word line driver area SWD1 of the third sub-circuit area SP3*a*' may be electrically connected to some (e.g., the odd-numbered word lines) of the word lines extending on the third sub-circuit area SP3*a*' and the fourth sub-circuit area SP4*a*'. The second sub-word line driver area SWD2 of the fourth sub-circuit area SP4*a*' may be electrically connected to some other ones (e.g., the even-numbered word lines) of the word lines extending on the third sub-circuit area SP3*a*' and the fourth sub-circuit area SP4*a*'.

In the third peripheral circuit area PCAa', the first sub-word line driver area SWD1 of the first sub-circuit area SP1*a*' and the second sub-word line driver area SWD2 of the second sub-circuit area SP2*a*' may be spaced apart from each other, and the first sub-word line driver area SWD1 of the third sub-circuit area SP3*a*' and the second sub-word line driver area SWD2 of the fourth sub-circuit area SP4*a*' may be spaced apart from each other. The first sub-word line driver area SWD1 of the first sub-circuit area SP1*a*' may be located to be in contact with the sub-sense amplifier area S/A of the third sub-circuit area SP3*a*', and the second sub-word line driver area SWD2 of the fourth sub-circuit area SP4*a*' may be located to be in contact with the sub-sense amplifier area S/A of the second sub-circuit area SP2*a*'.

Referring to FIG. 13D, the fourth peripheral circuit area PCAb' may include first to fourth sub-circuit areas SP1*b*' to SP4*b*'. Corresponding sub-array areas may be respectively located on the first to fourth sub-circuit areas SP1*b*' to SP4*b*', and the first to fourth sub-circuit areas SP1*b*' to SP4*b*' may each include the sub-word line driver area SWD, the sub-row decoder area R/D, the sub-sense amplifier area S/A, and the power control circuit area SAPC.

The first sub-word line driver area SWD1 of the first sub-circuit area SP1*b*' may be electrically connected to some (e.g., the odd-numbered word lines) of the word lines extending on the first sub-circuit area SP1*b*' and the second sub-circuit area SP2*b*'. The second sub-word line driver area SWD2 of the second sub-circuit area SP2*b*' may be electrically connected to some other ones (e.g., the even-numbered word lines) of the word lines extending on the first sub-circuit area SP1*b*' and the second sub-circuit area SP2*b*'.

The first sub-word line driver area SWD1 of the third sub-circuit area SP3*b*' may be electrically connected to some (e.g., the odd-numbered word lines) of the word lines extending on the third sub-circuit area SP3*b*' and the fourth sub-circuit area SP4*b*'. The second sub-word line driver area SWD2 of the fourth sub-circuit area SP4*b*' may be electrically connected to some other ones (e.g., the even-numbered word lines) of the word lines extending on the third sub-circuit area SP3*b*' and the fourth sub-circuit area SP4*b*'.

In the fourth peripheral circuit area PCAb', the first sub-word line driver area SWD1 of the first sub-circuit area SP1*b*' and the second sub-word line driver area SWD2 of the second sub-circuit area SP2*b*' may be spaced apart from each other, and the first sub-word line driver area SWD1 of the third sub-circuit area SP3*b*' and the second sub-word line driver area SWD2 of the fourth sub-circuit area SP4*b*' may be spaced apart from each other. The first sub-word line driver area SWD1 of the first sub-circuit area SP1*b*' may be located to be in contact with the first sub-word line driver area SWD1 of the third sub-circuit area SP3*b*', and the second sub-word line driver area SWD2 of the fourth sub-circuit area SP4*b*' may be located to be in contact with the second sub-word line driver area SWD2 of the second sub-circuit area SP2*b*'.

Referring to FIGS. 13A to 13D, in the peripheral circuit area of the memory device 10 according to embodiments of the inventive concept, the first peripheral circuit area PCAa may be repeatedly located, the second peripheral circuit area PCAb may be repeatedly located, the third peripheral circuit area PCAa' may be repeatedly located, and/or the fourth peripheral circuit area PCAb' may be repeatedly located. In other embodiments of the inventive concept, peripheral circuits selected from among the first to fourth peripheral circuit areas PCAa, PCAb, PCAa', and PCAb' may be combined and located together.

Figure 14:
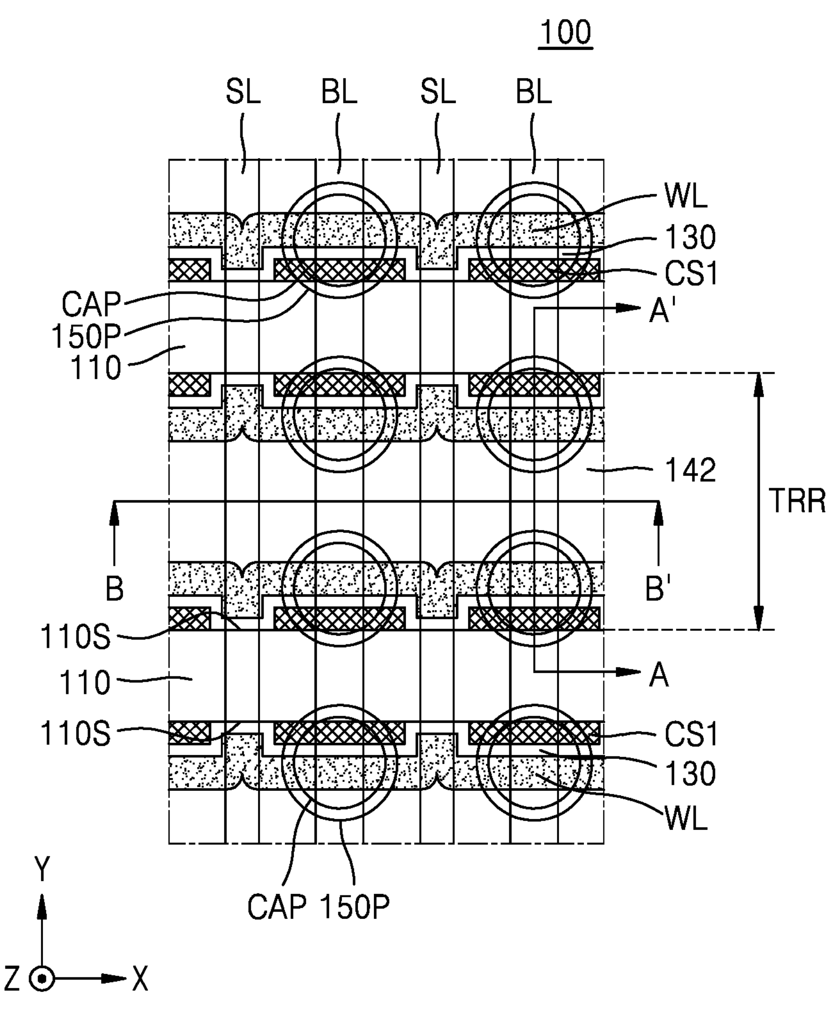
FIG. 14 is a plan layout diagram illustrating a partial configuration of a memory device according to some embodiments.
Figure 15A:
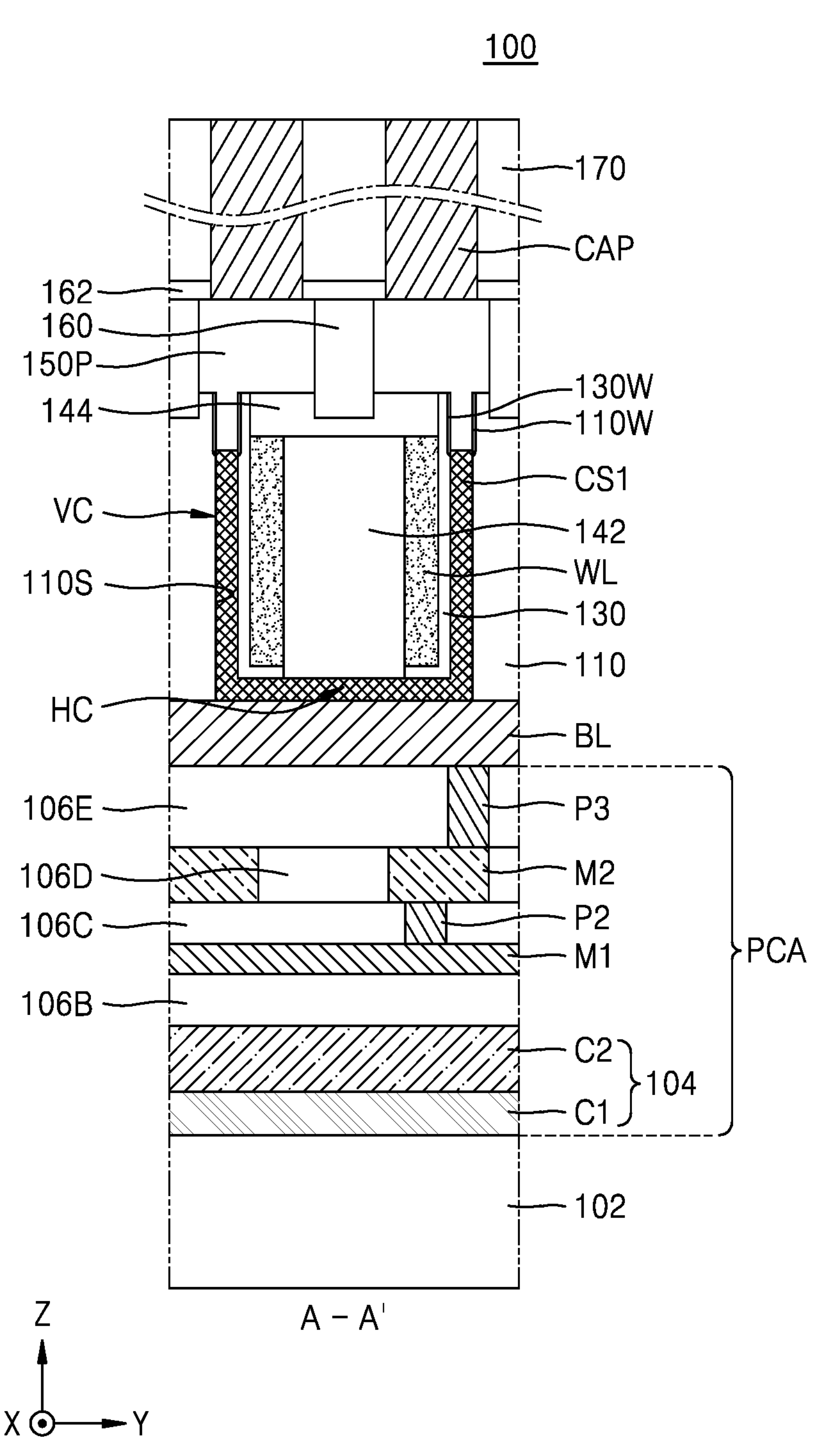
FIG. 15A is a cross-sectional view taken along line A-A' of FIG. 14.
Figure 15B:
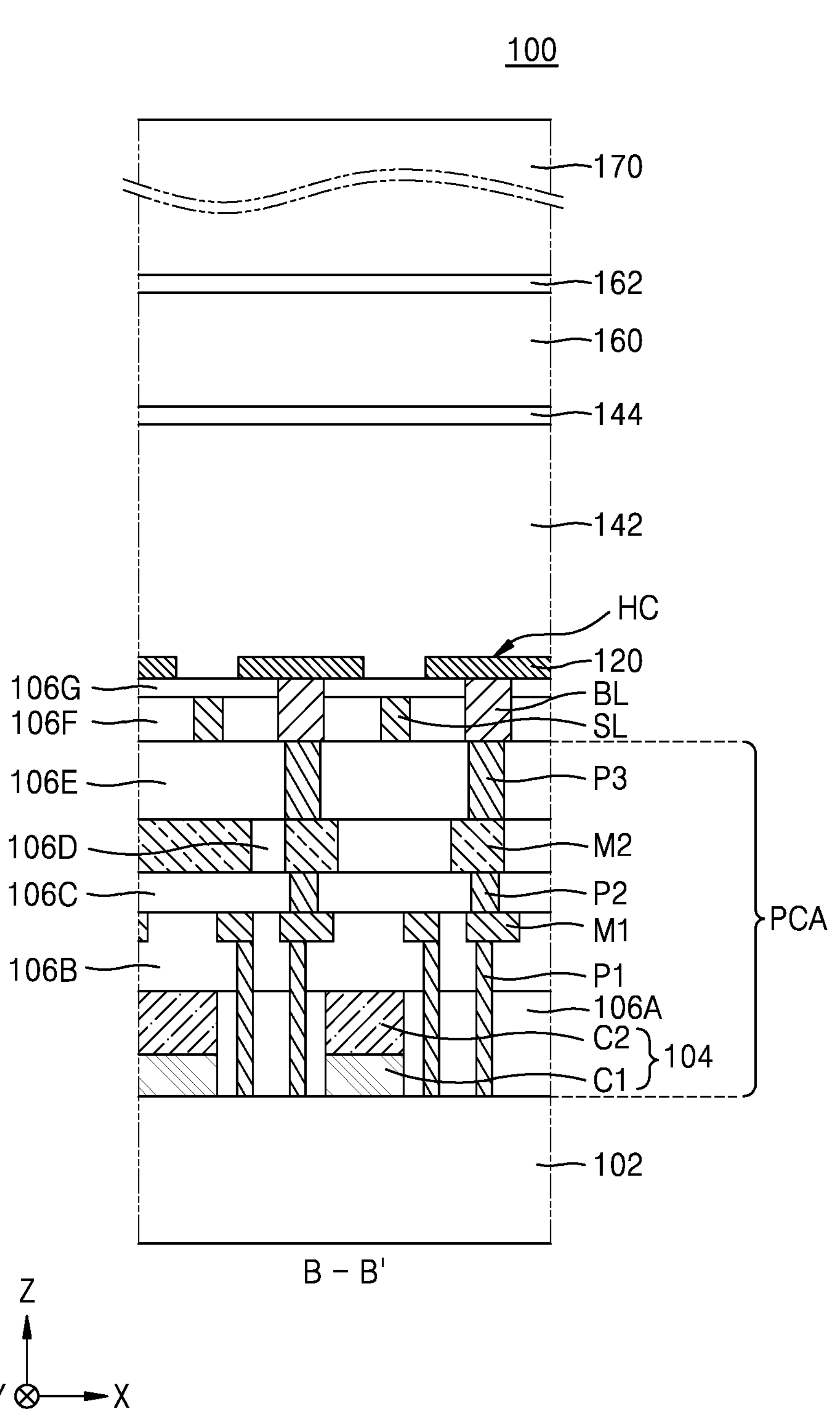
FIG. 15B is a cross-sectional view taken along line B-B' of FIG. 14.

FIG. 14 is a plan layout diagram illustrating a partial configuration of a memory device 100 according to embodiments. FIG. 15A is a cross-sectional view taken along line A-A' of FIG. 4, and FIG. 15B is a cross-sectional view taken along line B-B' of FIG. 14. FIG. 14 is a plan layout diagram illustrating the sub-cell array area UAA of FIG. 3.

Referring to FIGS. 14, 15A, and 15B, the memory device 100 may include a substrate 102, a peripheral circuit area PCA disposed on the substrate 102 and including a peripheral circuit, and a plurality of bit lines BL and a plurality of source lines SL disposed on the peripheral circuit area PCA.

In some embodiments, the substrate 102 may include silicon, such as monocrystalline silicon, polycrystalline silicon, and/or amorphous silicon. In some embodiments, the substrate 102 may include one or more materials, such as, but not limited to, Ge, SiGe, SiC, GaAs, InAs, and/or InP. In some embodiments, the substrate 102 may include a conductive region, for example, a well doped with impurities or a structure doped with impurities.

Each of the bit lines BL and the source lines SL may be connected to the peripheral circuit included in the peripheral circuit area PCA. For example, the bit lines BL may be connected to a sense amplifier (e.g., sense amplifier 54 of FIG. 2). Each of the bit lines BL and the source lines SL may be insulated from each other by an interlayer insulating layer 106F. The source lines SL may be at least partially covered with an interlayer insulating layer 106G, and the bit lines BL may pass through the interlayer insulating layers 106F and 106G in a vertical direction (a Z direction) and may be connected to a peripheral circuit included in the peripheral circuit area PCA through some of a plurality of conductive plugs P1, P2, and P3 and a plurality of wiring layers M1 and M2 included in the peripheral circuit area PCA.

The peripheral circuit area PCA may include a plurality of peripheral circuits 104. The peripheral circuits 104 may include a first conductive pattern C1 and a second conductive pattern C2 sequentially disposed on the substrate 102. The first conductive pattern C1 and the second conductive pattern C2 may constitute various circuit elements for controlling functions of semiconductor devices located above the peripheral circuit area PCA. For example, the first conductive pattern C1 and the second conductive pattern C2 may constitute a bit line sense amplifier connected to the bit lines BL.

In some embodiments, the peripheral circuit area PCA may further include various active elements, such as transistors, and various passive elements, such as capacitors, resistors, inductors, and the like.

In some embodiments, the peripheral circuits included in the peripheral circuit area PCA may include a word line driver, the sense amplifier 54, and/or a row decoder (e.g., 52 in FIG. 2). The peripheral circuits included in the peripheral circuit area PCA may include NMOS transistors and PMOS transistors. The peripheral circuits may be electrically connected to conductive lines disposed above the peripheral circuit area PCA through the conductive plugs P1, P2, and P3 and the wiring layers M1 and M2.

In the peripheral circuit area PCA, portions of the peripheral circuits 104, the conductive plugs P1, P2, and P3, and the wiring layers M1 and M2, which need to be insulated from each other, may maintain a required insulation distance by a plurality of interlayer insulating layers 106A, 106B, 106C, 106D, and 106E. Each of the interlayer insulating layers 106A, 106B, 106C, 106D, and 106E may include an oxide layer, a nitride layer, or combinations thereof, but embodiments of the inventive concept are not limited thereto.

The bit lines BL and the source lines SL may be spaced apart from each other in the first horizontal direction (e.g., the X direction) on the substrate 102 and may extend in the second horizontal direction (e.g., the Y direction) perpendicular to the first horizontal direction (X direction). The bit lines BL and the source lines SL may extend to be parallel to each other in the second horizontal direction (the Y direction). In some embodiments, the bit lines BL and the source lines SL may include Ti, TiN, Ta, TaN, Mo, Ru, W, WN, Co, Ni, TiSi, TiSiN, WSi, WSiN, TaSi, TaSiN, RuTiN, CoSi, NiSi, polysilicon, or combinations thereof, but embodiments of the inventive concept are not limited thereto.

A mold insulating pattern 110 may be disposed on the bit lines BL and the source lines SL. The mold insulating pattern 110 may have a sidewall 1105 defining a transistor region TRR. Each of the mold insulating pattern 110 and the transistor region TRR defined by a sidewall 1105 in the mold insulating pattern 110 may extend in the first horizontal direction (the X direction). The mold insulating pattern 110 may include a silicon oxide layer, a silicon nitride layer, or combinations thereof.

A plurality of cell transistors constituting memory cells of the memory device 100 may be located in the transistor region TRR. The cell transistors may include a plurality of channel structures CS1. The cell transistors may include two transistors facing each other in the second horizontal direction perpendicular to the first horizontal direction (the X direction), and the two transistors may share one channel structure CS1 selected from the channel structures CS1. However, embodiments of the memory device 100 according to the inventive concept are not limited thereto, and one cell transistor may be formed in one channel structure.

In the transistor region TRR, the channel structures CS1 may be arranged in a line in the first horizontal direction (the X direction). Each of the channel structures CS1 may include a vertical channel portion VC facing the sidewall 1105 of the mold insulating pattern 110 and a horizontal channel portion HC in contact with an upper surface of the bit line BL. In each of the channel structures CS1, the vertical channel portion VC may be in contact with the sidewall 1105 of the mold insulating pattern 110 and may extend from the horizontal channel portion HC in the vertical direction (the Z direction).

In an embodiment, each of the channel structures CS1 may include a main channel portion 120 and a channel contact portion disposed on the uppermost surface of the main channel portion 120. The main channel portion 120 may contact an upper surface of one bit line BL selected from among the bit lines BL. The main channel portion 120 may include an oxide semiconductor layer having a first composition, and the channel contact portion may include a material having a second composition, different from that of the first composition. For example, the oxide semiconductor layer included in the main channel portion 120 may include InGaZnO (IGZO), Sn-IGZO, InWO (IWO), InZnO (IZO), ZnSnO (ZTO), ZnO, yttrium-doped zinc oxide (YZO), InGaSiO (IGSO), InO, SnO, TiO, ZnON, MgZnO, ZrInZnO, HfInZnO, SnInZnO, SiInZnO, GaZnSnO, ZrZnSnO, or combinations thereof. For example, the main channel portion 120 may include IGZO. For example, the channel contact portion may include the same elements as those constituting the oxide semiconductor layer included in the main channel portion 120, and may further include one or more dopants, such as, but not limited to, aluminum (Al), boron (B), arsenic (As), fluorine (F), and/or hydrogen (H). In other embodiments, for example, the channel contact portion may include a second oxide semiconductor material having a composition, different from that of the first oxide semiconductor material included in the main channel portion 120, and may further include one or more dopants, such as, but not limited to, aluminum (Al), boron (B), arsenic (As), fluorine (F), and/or hydrogen (H). In another embodiment, the channel contact portion may include indium aluminum zinc oxide (IAZO).

A gate dielectric layer 130 at least partially covering the channel structure CS1 and a plurality of word lines WL at least partially covering the gate dielectric layer 130 may be located in the transistor region TRR. The word lines WL may extend in the first horizontal direction (the X direction) and may be disposed to be parallel to each other. FIGS. 14 and 15A illustrate a configuration in which two word lines WL are located in one transistor region TRR, but embodiments of the inventive concept are not limited thereto.

Each of the word lines WL may include a first portion facing the channel structure CS1 with the gate dielectric layer 130 therebetween and a second portion facing the mold insulating pattern 110 only with the gate dielectric layer 130 therebetween without the channel structure CS1.

The bit line BL may be spaced apart from the word line WL in the vertical direction (the Z direction) with the channel structure CS1 and the gate dielectric layer 130 therebetween. The bit line BL may have an upper surface in contact with the channel structure CS1.

In the transistor region TRR, the channel structure CS1 may face one surface of each of two word lines WL located in the transistor region TRR. The gate dielectric layer 130 may include portions in contact with the channel structures CS1 and portions in contact with the sidewall 110S of the mold insulating pattern 110. The gate dielectric layer 130 may include portions between the one surface of each of the two word lines WL and the vertical channel portion VC of the channel structure CS1 and portions between a lower surface of each of the two word lines WL and the horizontal channel portion HC of the channel structure CS1.

In some embodiments, the gate dielectric layer 130 may include a high-k dielectric layer having a dielectric constant that is greater than that of a silicon oxide layer. In some embodiments, the gate dielectric layer 130 may include one or more materials, such as, but not limited to, hafnium oxide (HfO), hafnium silicate (HfSiO), hafnium oxynitride (HfON), hafnium silicon oxynitride (HfSiON), lanthanum oxide (LaO), or lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), lead zirconate titanate (PZT), strontium bismuth tantalate (STB), bismuth iron oxide (BFO), strontium titanium oxide (SrTiO), yttrium oxide (YO), aluminum oxide (AlO), and/or lead scandium tantalum oxide (PbScTaO). Each of the word lines WL may include Ti, TiN, Ta, TaN, Mo, Ru, W, WN, TiSiN, WSiN, polysilicon, or combinations thereof.

A lower insulating barrier 142 may be disposed on the channel structure CS1 between two word lines WL located in one transistor region TRR. An upper surface of each of the two word lines WL and an upper surface of the lower insulating barrier 142 may be at least partially covered with an upper insulating barrier 144. In the second horizontal direction (the Y direction), a width of the upper insulating barrier 144 may be greater than that of the lower insulating barrier 142. The lower insulating barrier 142 and the upper insulating barrier 144 may each include a silicon oxide layer, a silicon nitride layer, or combinations thereof.

A plurality of conductive contact patterns 150P may be disposed on the channel structures CS1. Each of the conductive contact patterns 150P may be connected to one channel structure CS1 selected from the channel structures CS1.

The conductive contact patterns 150P may be arranged in a regular manner at regular intervals therebetween in the first horizontal direction (the X direction) and the second horizontal direction (the Y direction). Although FIG. 14 shows an example in which the conductive contact patterns 150P are arranged to have a matrix structure on a plane (e.g., an X-Y plane) of the substrate 102, embodiments of the inventive concept are not limited thereto. For example, the conductive contact patterns 150P may be arranged to have a honeycomb structure on the plane (e.g., the X-Y plane) of the substrate 102. The conductive contact patterns 150P may be insulated from each other by an isolation insulating layer 160.

Each of the conductive contact patterns 150P may be located in a position spaced apart from the word line WL with the gate dielectric layer 130 therebetween. Each of the conductive contact patterns 150P may include a metal-containing layer. In some embodiments, each of the conductive contact patterns 150P may include Ti, TiN, Ta, TaN, Mo, Ru, W, WN, TiSiN, WSiN, or combinations thereof. For example, each of the conductive contact patterns 150P may have a stacked structure of a conductive barrier layer including TiN and a conductive layer including W.

The gate dielectric layer 130 may include a dielectric barrier liner 130W in contact with the conductive contact pattern 150P, and the mold insulating pattern 110 may include a mold barrier liner 110W in contact with the conductive contact pattern 150P. The dielectric barrier liner 130W may act as a barrier suppressing an unwanted reaction between a metal (e.g., tungsten) included in the conductive contact pattern 150P and a material (e.g., oxygen atoms) included in the gate dielectric film layer 130. The mold barrier liner 110W may act as a barrier suppressing an unwanted reaction between a metal (e.g., tungsten) included in the conductive contact pattern 150P and a material (e.g., oxygen atoms) included in the mold barrier liner 110W.

The memory device 100 may further include a plurality of capacitor structures CAP disposed on the conductive contact patterns 150P. The capacitor structures CAP may be cell capacitors constituting memory cells of the memory device 100. An etch stop layer 162 and an interlayer insulating layer 170 may be sequentially stacked on the conductive contact patterns 150P and the isolation insulating layer 160. Each of the capacitor structures CAP may pass through the interlayer insulating layer 170 and the etch stop layer 162 in the vertical direction (the Z direction) to be connected to one conductive contact pattern 150P selected from the conductive contact patterns 150P. The etch stop layer 162 may include a silicon nitride layer, and the interlayer insulating layer 170 may include a silicon oxide layer.

A plate poly may be formed on the capacitor structures CAP to at least partially cover the cell capacitor structures CAP. The plate poly may be a component for applying a voltage to one end of the cell capacitors formed on each of the cell capacitor structures CAP.

Figure 16:
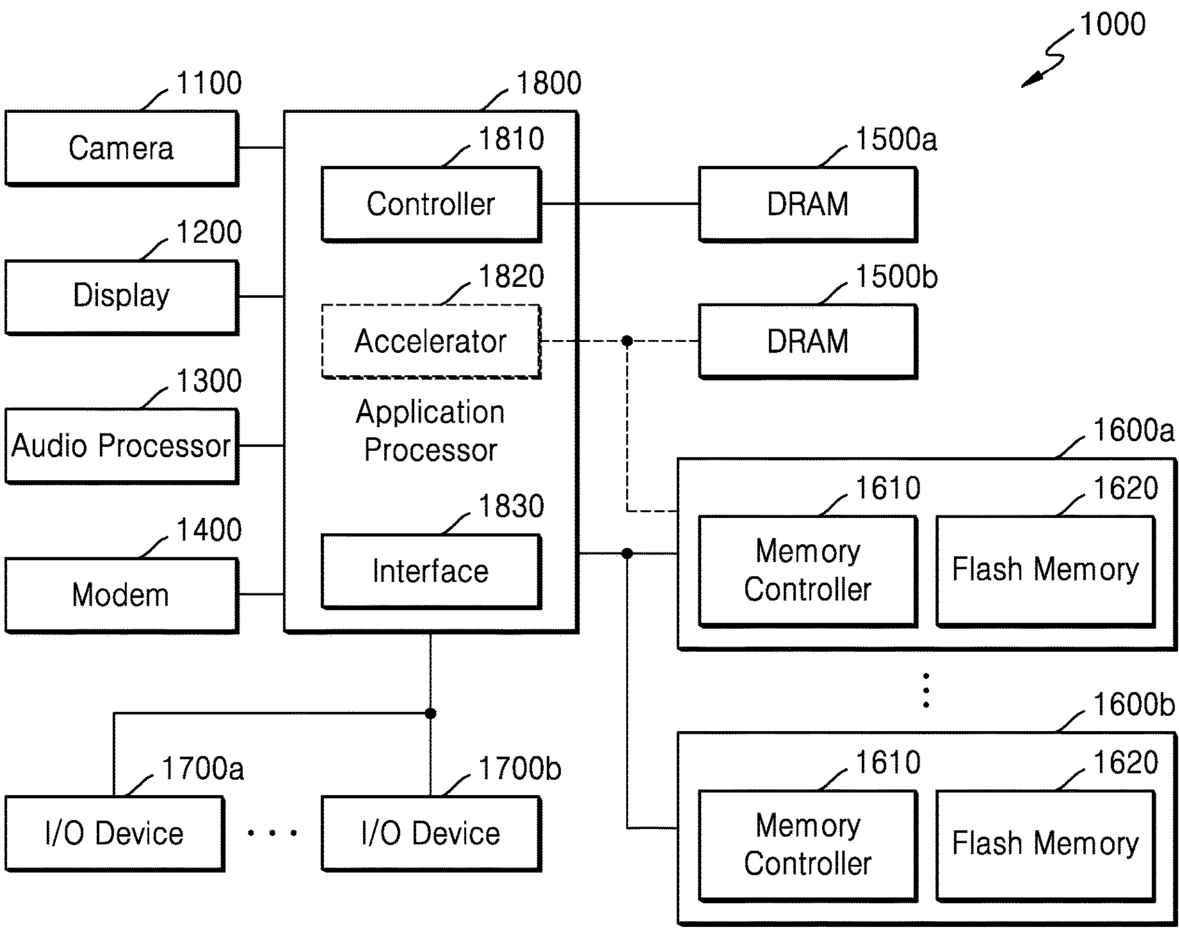
FIG. 16 is a block diagram illustrating a system including a memory device according to some embodiments.

FIG. 16 is a block diagram illustrating a system 1000 including a memory device according to embodiments.

Referring to FIG. 16, the system 1000 may include a camera 1100, a display 1200, an audio processor 1300, a modem 1400, DRAMs **1500*a* and 1500*b*, flash memory devices 1600*a* and 1600*b*, I/O devices 1700*a* and 1700*b*, and an application processor (AP) 1800. The system 1000 may be implemented as a laptop computer, a mobile phone, a smartphone, a tablet PC, a wearable device, a healthcare device, or an IoT device. In addition, the system 1000** may be implemented as a server or a PC.

The camera 1100 may be configured to capture a still image or a video according to a user's control, and may be configured to store the captured image/video data or may be configured to transmit the image/video to the display 1200. The audio processor 1300 may be configured to process audio data included in the content of the flash memory devices **1600*a* and 1600*b* or a network. The modem 1400 may be configured to modulate and transmit a signal to transmit/receive wired/wireless data, and a receiver may be configured to demodulate the signal to restore the original signal thereof. The I/O devices 1700*a* and 1700*b*** may include devices providing digital input and/or output functions, such as a universal serial bus (USB) or storage, a digital camera, a secure digital (SD) card, a digital versatile disc (DVD), a network adapter, and a touch screen.

The AP 1800 may be configured to control the overall operation of the system 1000. The AP 1800 may include a controller 1810 and an interface 1830. The AP 1800 may control the display 1200 so that a portion of the content stored in the flash memory devices 1600*a* and 1600*b* is displayed on the display 1200. When a user input is received through the I/O devices 1700*a* and 1700*b*, the AP 1800 may be configured to perform a control operation corresponding to the user input. The AP 1800 may include an accelerator 1820 (e.g., an accelerator block, which is a dedicated circuit for an artificial intelligence (AI) data operation, or an accelerator chip separately from the AP 1800). The DRAM 1500*b* may be additionally mounted on the accelerator block or the accelerator chip. An accelerator is a function block that performs a certain function of the AP 1800, and the accelerator may include a GPU that is a function block that performs graphic data processing, a neural processing unit (NPU) that is a block that performs AI calculation and inference, and a data processing unit (DPU) that is a block performs data transmission.

The system 1000 may include the DRAMs 1500*a* and 1500*b*. The AP 1800 may control the DRAMs 1500*a* and 1500*b* through a command and mode register (MRS) setting conforming to the JEDEC standard or may set a DRAM interface protocol to use company-specific functions such as low voltage/high speed/reliability and cyclic redundancy check (CRC)/error correction code (ECC) function to perform communication. For example, the AP 1800 may communicate with the DRAM 1500*a* through an interface conforming to the JEDEC standard such as LPDDR4 and LPDDR5, and the accelerator block or the accelerator chip may set a new DRAM interface protocol to control the DRAM 1500*b* for an accelerator having a higher bandwidth than the DRAM 1500*a* to perform communication.

Although only the DRAMs 1500*a* and 1500*b* are illustrated in FIG. 16, embodiments of the inventive concept are not limited thereto, and any memory, such as PRAM, SRAM, MRAM, RRAM, ferroelectric RAM (FRAM), or hybrid RAM may be used as long as a bandwidth, a response speed, and voltage conditions of the AP 1800 or the accelerator chip are satisfied. The DRAMs 1500*a* and 1500*b* have relatively smaller latency and bandwidth than the I/O devices 1700*a* and 1700*b* or the flash memory devices 1600*a* and 1600*b*. The DRAMs 1500*a* and 1500*b* may be initialized when the system 1000 is powered on, and loaded with an operating system and application data, to be used as temporary storage locations for the operating system and application data or as execution spaces for various software code.

In the DRAMs 1500*a* and 1500*b*, addition/subtraction/multiplication/division operations, vector operations, address operations, or fast Fourier transform (FFT) operations may be performed. In addition, a function for execution used for inference may be performed in the DRAMs 1500*a* and 1500*b*. Here, the inference may be performed in a deep learning algorithm using an artificial neural network. The deep learning algorithm may include an operation of training a model through various data and an inference operation of recognizing data with the trained model. As an embodiment, an image captured by the user through the camera 1100 may be signal-processed and stored in the DRAM 1500*b*, and the accelerator block or the accelerator chip may perform AI data operations to recognize data stored in the DRAM 1500*b* and data using a model operating in inference mode.

The system 1000 may include a plurality of storage devices or a plurality of flash memory devices 1600*a* and 1600*b* having a larger capacity than the DRAMs 1500*a* and 1500*b*. The accelerator block or the accelerator chip may be configured to perform an AI training operation and an AI data operation by using the flash memory devices 1600*a* and 1600*b*. Each of the flash memory devices 1600*a* and 1600*b* comprise a memory controller 1610 and flash memory 1620. In embodiments, the flash memory devices 1600*a* and 1600*b* may be configured to perform the AI training operation and inference AI data operation, which are performed by the AP 1800 and/or the accelerator chip, more efficiently, using a computing device included in the memory controller 1610. The flash memory devices 1600*a* and 1600*b* may store pictures taken through the camera 1100 or data transmitted through a data network. For example, the flash memory devices 1600*a* and 1600*b* may store augmented reality (AR)/virtual reality (VR), high definition (HD), or ultra HD (UHD) content.

In the system 1000, DRAMs 1500*a* and 1500*b* may include the memory device described above with reference to FIGS. 1 to 15B. Because each of DRAMs 1500*a* and 1500*b* includes a peripheral circuit buried and located below the memory cell array, the word lines may be connected to the sub-word line drivers, and thus, the word line driving force of the DRAMs 1500*a* and 1500*b* may be improved. In addition, because each of the DRAMs 1500*a* and 1500*b* eliminates a separate contact connected to an upper metal layer to provide a signal to a peripheral circuit between sub-array areas in which memory cells are formed, the size of each of DRAMs 1500*a* and 1500*b* may be reduced.

While the inventive concept has been particularly shown and described with reference to embodiments thereof, it will be understood that various changes in form and details may be made therein without departing from the spirit and scope of the following claims.

What is claimed is:

1. A memory device comprising:

a plurality of sub-array areas each including a plurality of memory cells, the plurality of sub-array areas comprising a first sub-array area including a first plurality of memory cells and a second sub-array area spaced from the first sub-array area in a first direction and including a second plurality of memory cells;

a plurality of contact areas located between the plurality of sub-array areas, the plurality of contact areas comprising a first contact area located between the first sub-array area and the second sub-array area in the first direction;

a plurality of word lines each extending in the first direction to cross the plurality of sub-array areas and the plurality of contact areas, the plurality of word lines including a first word line extending in the first direction and crossing the first sub-array area, the first contact area, and the second sub-array area, and the plurality of word lines further including a second word line extending in the first direction and crossing the first sub-array area, the first contact area, and the second sub-array area; and a plurality of sub-word line drivers beneath the plurality of sub-array areas and configured to apply driving voltage to the plurality of word lines, the plurality of sub-word line drivers comprising a first sub-word line driver configured to apply driving voltage to the first word line and a second sub-word line driver configured to apply driving voltage to the second word line, wherein each of the plurality of contact areas comprises a plurality of contacts electrically connecting a corresponding word line, among the plurality of word lines, to a sub-word line driver, the plurality of contacts of the first contact area comprising a first contact connecting the first word line to the first sub-word line driver and a second contact connecting the second word line to the second sub-word line driver.

2. The memory device of claim 1, wherein each of the plurality of sub-array areas is located such that one surface thereof is in contact with another one of the plurality of sub-array areas and another surface thereof is in contact with a corresponding one of the plurality of contact areas.

3. The memory device of claim 1, wherein, in each of the plurality of contact areas, the plurality of contacts connected to all of the plurality of word lines extending to cross the plurality of contact areas are located.

4. The memory device of claim 1, wherein the plurality of contact areas includes a third contact area and a fourth contact area, and wherein each of the plurality of sub-array areas has one surface thereof that is in contact with the first contact area and another surface that is in contact with the fourth contact area.

5. The memory device of claim 1, further comprising:

a plurality of bit lines each extending in a second direction perpendicular to the first direction; and a plurality of bit line sense amplifiers electrically connected to the plurality of bit lines and located below the plurality of sub-array areas in a direction perpendicular to a plane formed by the first direction and the second direction, wherein the plurality of sub-word line drivers are located below the plurality of sub-array areas in the direction perpendicular to a plane formed by the first direction and the second direction.

6. The memory device of claim 1, further comprising:

a plurality of bit lines located only in the plurality of sub-array areas, among the plurality of sub-array areas and the plurality of contact areas, and extending in a second direction perpendicular to the first direction.

7. The memory device of claim 1, wherein the plurality of memory cells comprise a plurality of cell capacitor structures located only in the plurality of sub-array areas, among the plurality of sub-array areas and the plurality of contact areas.

8. The memory device of claim 1, wherein the plurality of memory cells comprises a plurality of cell capacitor structures located in the plurality of sub-array areas; and wherein the memory device further comprises:

a plurality of dummy capacitor structures located in the plurality of sub-array areas.

9. The memory device of claim 1, further comprising:

a plurality of dummy capacitor structures located in the plurality of contact areas.

10. A memory device comprising:

a memory cell area comprising a memory array including a plurality of memory cells; and a peripheral circuit area beneath the memory cell area and including a peripheral circuit, wherein the memory cell area further comprises:

a plurality of sub-array areas each including the plurality of memory cells, the plurality of sub-array areas comprising a first sub-array area including a first subset of the plurality of memory cells and a second sub-array area spaced from the first sub-array area in a first direction and including a second subset of the plurality of memory cells;

a plurality of contact areas located between the plurality of sub-array areas, the plurality of contact areas comprising a first contact area located between the first sub-array area and the second sub-array area in the first direction; and a plurality of word lines each extending in the first direction to cross the plurality of sub-array areas and the plurality of contact areas, the plurality of word lines comprising a first word line extending in the first direction and crossing the first sub-array area, the first contact area, and the second sub-array area, and the plurality of word lines further comprising a second word line extending in the first direction and crossing the first sub-array area, the first contact area, and the second sub-array area, wherein the plurality of contact areas includes a plurality of contacts electrically connecting the plurality of word lines to the peripheral circuit, the plurality of contacts including a first contact of the first contact area electrically connecting the first word line to the peripheral circuit and a second contact of the first contact area electrically connecting the second word line to the peripheral circuit, and wherein the peripheral circuit is configured to apply driving voltage to the first word line and the second word line of the plurality of word lines.

11. The memory device of claim 10, wherein the peripheral circuit area includes:

a plurality of sub-word line driver areas comprising a plurality of sub-word line drivers configured to drive the plurality of word lines; and a plurality of sub-sense amplifier areas comprising a plurality of bit line sense amplifiers electrically connected to a plurality of bit lines.

12. The memory device of claim 11, wherein each of the plurality of word lines is connected to at least two corresponding sub-word line drivers, among the plurality of sub-word line drivers.

13. The memory device of claim 11, wherein the peripheral circuit area includes first to fourth sub-circuit areas located adjacent to each other in the first direction and a second direction perpendicular to the first direction, wherein each of the first to fourth sub-circuit areas includes one sub-word line driver area and one sub-sense amplifier area, wherein a sub-sense amplifier area of the first sub-circuit area is located adjacent to a sub-sense amplifier area of the second sub-circuit area in the first direction, and wherein a sub-word line driver area of the third sub-circuit area is located to be adjacent to a sub-word line driver area of the fourth sub-circuit area in the first direction.

14. The memory device of claim 11, wherein the peripheral circuit area includes first to fourth sub-circuit areas located adjacent to each other in the first direction and a second direction perpendicular to the first direction, wherein each of the first to fourth sub-circuit areas includes one sub-word line driver area and one sub-sense amplifier area, wherein a sub-word line driver area of the first sub-circuit area is spaced apart from a sub-word line driver area of the second sub-circuit area in the first direction, and wherein a sub-word line driver area of the third sub-circuit area is spaced apart from a sub-word line driver area of the fourth sub-circuit area in the first direction.

15. A memory device comprising:

a plurality of sub-array areas each including a plurality of memory cells;

a plurality of contact areas located between the plurality of sub-array areas;

a plurality of word lines each extending in a first direction; and a plurality of sub-word line drivers beneath the plurality of sub-array areas and configured to apply driving voltage to the plurality of word lines, wherein each of the plurality of contact areas comprises a plurality of contacts electrically connecting a corresponding word line, among the plurality of word lines, to a sub-word line driver, and wherein each of the plurality of word lines is connected to at least two corresponding sub-word line drivers, among the plurality of sub-word line drivers, and is configured to receive driving voltage from the at least two corresponding sub-word line drivers.

16. The memory device of claim 15, wherein each of the plurality of sub-array areas is located such that one surface thereof is in contact with another one of the plurality of sub-array areas and another surface thereof is in contact with a corresponding one of the plurality of contact areas.

17. The memory device of claim 15, wherein, in each of the plurality of contact areas, the plurality of contacts connected to all of the plurality of word lines located in the plurality of contact areas, among the plurality of word lines, are located.

18. The memory device of claim 15, further comprising:

a plurality of bit lines located only in the plurality of sub-array areas, among the plurality of sub-array areas and the plurality of contact areas, and extending in a second direction perpendicular to the first direction.

19. The memory device of claim 15, wherein the plurality of memory cells comprise a plurality of cell capacitor structures located only in the plurality of sub-array areas, among the plurality of sub-array areas and the plurality of contact areas.

20. The memory device of claim 15, further comprising:

a plurality of dummy capacitor structures located in the plurality of contact areas.

* * * * *